US007514183B2

(12) United States Patent
Hsu et al.

(10) Patent No.: US 7,514,183 B2
(45) Date of Patent: Apr. 7, 2009

(54) METHOD FOR PERFORMING TRANSMISSION TUNING OF A MASK PATTERN TO IMPROVE PROCESS LATITUDE

(75) Inventors: Stephen D. Hsu, Fremont, CA (US); Jang Fung Chen, Cupertino, CA (US); Xuelong Shi, San Jose, CA (US); Douglas Van Den Broeke, Sunnyvale, CA (US)

(73) Assignee: ASML Masktools B.V., AH Veldhoven (NL)

(*) Notice: Subject to any disclaimer, the term of this patent is extended or adjusted under 35 U.S.C. 154(b) by 841 days.

(21) Appl. No.: 10/981,762

(22) Filed: Nov. 5, 2004

(65) Prior Publication Data

US 2005/0196682 A1 Sep. 8, 2005

Related U.S. Application Data

(60) Provisional application No. 60/517,082, filed on Nov. 5, 2003.

(51) Int. Cl.
*G03F 1/00* (2006.01)
*G06F 17/50* (2006.01)

(52) U.S. Cl. ............................................ 430/5; 716/19

(58) Field of Classification Search ..................... 430/5; 716/19

See application file for complete search history.

(56) References Cited

U.S. PATENT DOCUMENTS

| | | | | |
|---|---|---|---|---|
| 6,519,760 | B2 | 2/2003 | Shi et al. | |
| 6,553,562 | B2 | 4/2003 | Capodieci et al. | |
| 6,703,167 | B2 | 3/2004 | LaCour | |
| 6,792,591 | B2 | 9/2004 | Shi et al. | |
| 2002/0152451 | A1* | 10/2002 | Shi et al. | 716/19 |
| 2004/0003368 | A1 | 1/2004 | Hsu et al. | |
| 2004/0265707 | A1 | 12/2004 | Socha | |
| 2005/0053848 | A1 | 3/2005 | Wampler et al. | |
| 2005/0102648 | A1 | 5/2005 | Hsu et al. | |

FOREIGN PATENT DOCUMENTS

EP 1 237 046 A2 9/2002

OTHER PUBLICATIONS

Chinese Office Action, with English Translation, issued in corresponding Chinese Patent Application No. 200410103273.5, dated on Nov. 9, 2007.

(Continued)

*Primary Examiner*—Mark F Huff
*Assistant Examiner*—John Ruggles
(74) *Attorney, Agent, or Firm*—Pillsbury Winthrop Shaw Pittman LLP

(57) ABSTRACT

A method of generating a mask for use in a photolithography process. The method includes the steps of determining a target mask pattern having a plurality of features to be imaged and an illumination system to be utilized to image the mask; identifying a critical pitch within the target pattern and optimizing illumination settings of the illumination system for imaging the critical pitch; identifying a forbidden pitch within the target pattern; and modifying the transmittance of the features having a pitch equal to or substantially equal to the forbidden pitch such that the exposure latitude of the features equal to or substantially equal to the forbidden pitch is increased.

12 Claims, 32 Drawing Sheets

OTHER PUBLICATIONS

Hsu, Stephen, D., et al. "Low $k_1$ Lithography Patterning Option for the 90nm and 65nm Nodes." Proceedings of the SPIE—The International Society For Optical Engineering, vol. 5130, No. 1, Aug. 2003, XP002319885, ISSN/I 0277-786X, pp. 812-828.

Socha, Robert., et al. "Forbidden Pitches for 130nm lithography and below." Proceedings of the SPIE, vol. 4000, No. Part 2, Mar. 1, 2000, XP009018640, ISSN: 0277-786X, pp. 1140-1155.

Hsu, Chungwei, et al. "Patterning Half-wavelength DRAM cell Using Chromeless Phase Lithography (CPL)." Optical Microlithography XV, Proceedings of SPIE, vol. 4691, 2002, pp. 76-88.

Socha, Robert., et al. "Extending KrF to 100nm imaging with high-NA and chromeless phase lithography technology." Optical Microlithography XV, Proceedings of SPIE vol. 4691, 2002, pp. 446-458.

Van Den Broeke, Douglas., et al. "Complex 2 D Pattern Lithography at λ/4 Resolution Using Chromelss Phase Lithography (CPL)." Optical Microlithography XV, Proceedings of SPIE vol. 4691, 2002, pp. 196-214.

Shi, Xuelong., et al. "Understanding the Forbidden Pitch and Assist Feature Placement." 21st Annual BACUS Symposium on Photomask Technology, Proceedings of SPIE, vol. 4562, 2002, pp. 968-979.

Fung Chen, J., et al. "Binary Halftone Chromeless PSM Technology for λ/4 Optical Lithography." Optical Lithography XIV, Proceedings of SPIE, vol. 4346, 2001, pp. 515-533.

Hsu, Stephen D., et al. "RET Integration of CPL™ Technology for Random Logic." Optical Microlithography XVII, Proceedings of SPIE, vol. 5377, pp. 510-526.

* cited by examiner

Bin

6%

25%

35%

100%

METHOD FOR PERFORMING TRANSMISSION TUNING OF A MASK PATTERN TO IMPROVE PROCESS LATITUDE

CLAIM OF PRIORITY

The present invention claims priority from U.S. provisional application No. 60/517,082, and entitled "Transmission Tuning For Forbidden Pitch," filed Nov. 5, 2003.

FIELD OF THE INVENTION

The present invention relates to a photolithographic method for tuning the transmittance of features in a target mask pattern to be formed on a surface of a substrate so as to optimize the overall process latitude and minimize problems associated with "forbidden pitches" within the target pattern.

BACKGROUND

Lithographic apparatus can be used, for example, in the manufacture of integrated circuits (ICs). In such a case, the mask may contain a circuit pattern corresponding to an individual layer of the IC, and this pattern can be imaged onto a target portion (e.g., comprising one or more dies) on a substrate (silicon wafer) that has been coated with a layer of radiation-sensitive material (resist). In general, a single wafer will contain a whole network of adjacent target portions that are successively irradiated via the projection system, one at a time. In one type of lithographic projection apparatus, each target portion is irradiated by exposing the entire mask pattern onto the target portion in one go; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. More information with regard to lithographic devices as described herein can be gleaned, for example, from U.S. Pat. No. 6,046,792, incorporated herein by reference.

In a manufacturing process using a lithographic projection apparatus, a mask pattern is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g., an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection systems, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Twin stage lithographic apparatus are described, for example, in U.S. Pat. No. 5,969,441 and WO 98/40791, incorporated herein by reference.

The photolithographic masks referred to above comprise geometric patterns corresponding to the circuit components to be integrated onto a silicon wafer. The patterns used to create such masks are generated utilizing CAD (computer-aided design) programs, this process often being referred to as EDA (electronic design automation). Most CAD programs follow a set of predetermined design rules in order to create functional masks. These rules are set by processing and design limitations. For example, design rules define the space tolerance between circuit devices (such as gates, capacitors, etc.) or interconnect lines, so as to ensure that the circuit devices or lines do not interact with one another in an undesirable way. The design rule limitations are typically referred to as "critical dimensions" (CD). A critical dimension of a circuit can be defined as the smallest width of a line or the smallest space between two lines. Thus, the CD determines the overall size and density of the designed circuit.

Of course, one of the goals in integrated circuit fabrication is to faithfully reproduce the original circuit design on the wafer (via the mask). Another goal is to use as much of the semiconductor wafer real estate as possible. Even another goal is to optimize illumination and enhance the contrast of an image on a wafer. Even yet another goal is to increase Depth of Focus (DOF) and Exposure Latitude (EL).

However, for low $k_1$ lithography, optical proximity effects caused by the interaction between the features of interest with the neighboring structure becomes much more severe. At a given NA setting, such structural interactions not only affect the critical dimension, but also impact the exposure latitude of the feature. Previous studies have shown that at the so-called "forbidden pitches" (i.e., pitches that exhibit poor image contrast for the given process), the exposure latitude is very poor. For pitches that are large enough to allow for insertion of assist features, such as scattering bars, the exposure latitude can be improved. However, at pitches exhibiting poor imaging performance where there is not enough space for inserting such assist features, the through pitch process latitude is limited by such "forbidden pitches" as the name suggests.

Accordingly, there is exists a need for compensating or improving the process latitude at forbidden pitches which are in a range that does not allow for assist features to be included in the mask design.

SUMMARY

In view of the foregoing, the present invention relates to a process/method for modifying a target mask pattern such that it is no longer necessary to avoid utilizing "forbidden pitches" within the actual mask design. The present invention provides a method for modifying the mask design such that the exposure latitude at the forbidden pitches is increased such that the overall process latitude through pitch is optimized.

More specifically, the present invention relates to a method of generating a mask for use in a photolithography process. The method includes the steps of determining a target mask pattern having a plurality of features to be imaged and an illumination system to be utilized to image the mask; identifying a critical pitch within the target pattern and optimizing the illumination settings of the illumination system for imaging the critical pitch; identifying a forbidden pitch within the target pattern; and modifying the transmittance of the features having a pitch equal to or substantially equal to the forbidden pitch such that the exposure latitude of the features equal to or substantially equal to the forbidden pitch is increased.

The present invention provides significant advantages over the prior art processes. Most importantly, the present invention eliminates the need to avoid utilizing "forbidden pitches" within the target mask pattern, thereby providing an increase in the overall process latitude of the imaging system. Indeed, the method of the present invention operates to optimize the imaging performance at the forbidden pitches for the given illumination system and settings, thereby improving the overall process latitude of the imaging process.

The foregoing and other features, aspects, and advantages of the present invention will become more apparent from the following detailed description of the present invention when taken in conjunction with the accompanying drawings.

BRIEF DESCRIPTION OF THE DRAWINGS

FIG. 4(*b*) illustrates the NILS plot versus mask transmittance for various defocus conditions for the given example.

FIG. 5(*b*) illustrates how application of a negative bias to the features in the example of FIG. 4(*a*) can improve imaging.

FIG. 6(*b*) illustrates the total energy captured for the $0^{th}$ and +/−$1^{st}$ diffraction orders for the example of FIG. 6(*a*).

FIG. 18(*b*) illustrates the exposure latitude versus defocus plot for the example of FIG. 18(*a*).

FIG. 20(*b*) illustrates the exposure-dose latitude for the same process, with the mask modified to include 50 nm center scattering bars.

DETAILED DESCRIPTION OF THE DRAWINGS

Prior to discussing the details regarding the method of present invention for tuning the transmission of the mask features for various pitches contained in the target pattern so as optimize the process latitude for the given mask and process, an overview of the various technical principles involved with the method of the present invention is discussed.

As is known, the transmission value of mask features (i.e., the percentage of light the mask feature allows to pass to the substrate being imaged) influences the primary diffraction orders that determine the aerial image intensity at the substrate. Traditionally, the percentage value associated with, for example, an attenuated phase shift mask (Att-PSM) refers to the intensity transmittance of the attenuating layer. For coherent illumination, the intensity transmittance function T(x) is related to the amplitude transmittance function t(x) for the electric field and can be expressed as a complex value:

$$t(x)=\sqrt{T(x)}\cdot\exp(j\phi(x)) \quad (1)$$

where φ(x) is the phase shift introduced by the attenuated materials for Att-PSM or by the quartz etch step for CPL.

When the phase-shifter introduces a 180-degree phase shift with respect to the mask background, the amplitude transmittance function is equal to the negative square root of the intensity transmittance function, $t(x)=-\sqrt{T(x)}$.

Figure 1:
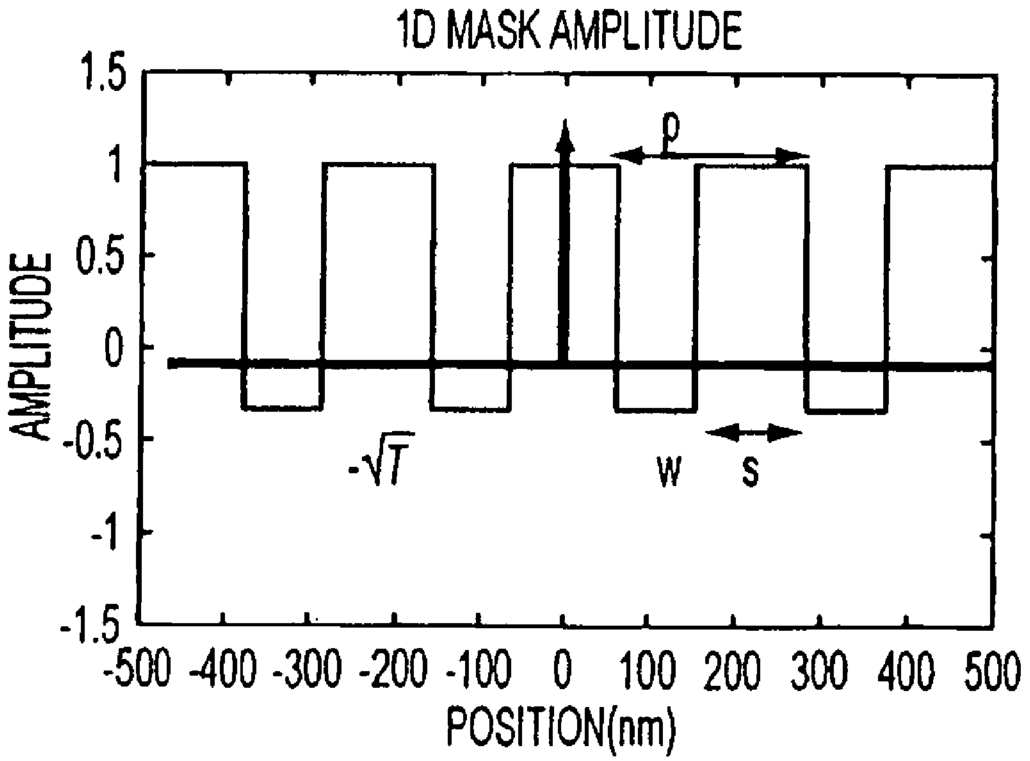
FIG. 1 illustrates an exemplary line:space pattern and the corresponding amplitude response.
Figure 2A:
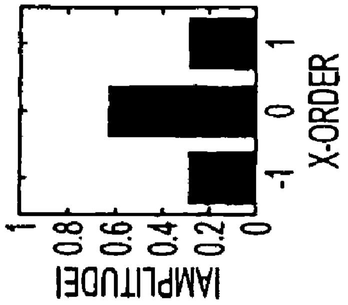
FIGS. 2(*a*)-2(*j*) illustrate how the diffraction orders captured by the projection pupil vary in accordance with varying transmission percentages for the mask features.
Figure 2B:
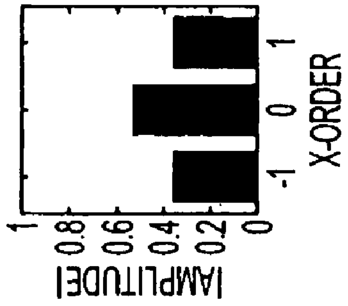
Figure 2C:
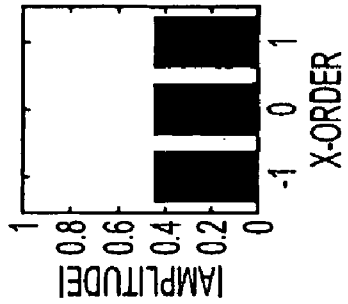
Figure 2D:
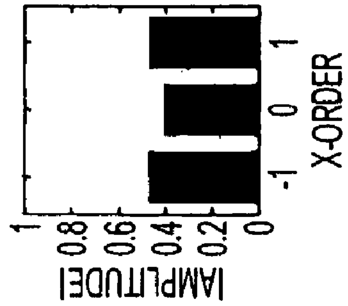
Figure 2E:
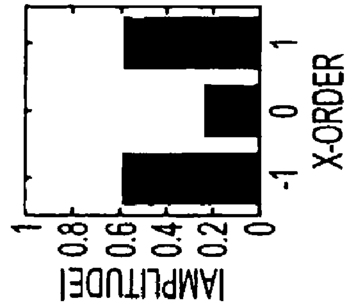
Figure 2F:
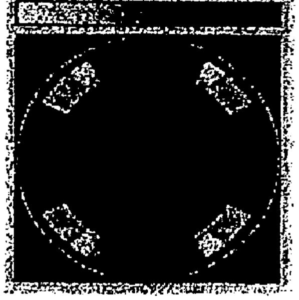
Figure 2G:
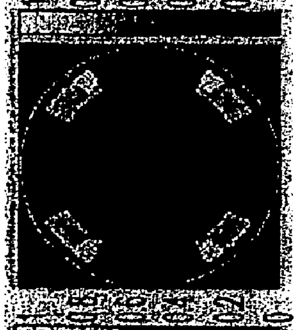
Figure 2H:
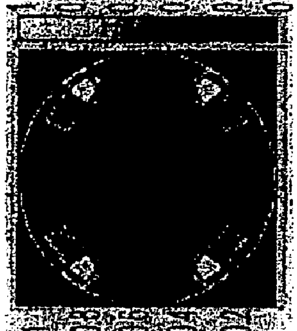
Figure 2I:
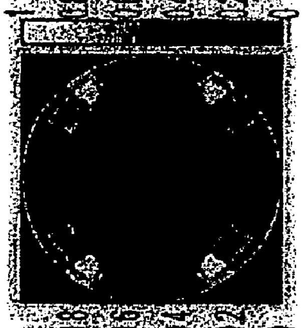
Figure 2J:
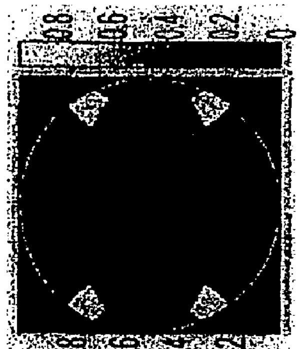

For example, referring to FIG. 1, considering an infinite grating on a clear field mask with a line width "w", a pitch "p", an amplitude transmittance "t(x)", and 180-degree phase shift, the mask transmission m(x) can be expressed as set forth in equation (2):

$$m(x)=\frac{1}{p}rect\left(\frac{x}{s}\right)\otimes comb\left(\frac{x}{p}\right)-\sqrt{T}\,\frac{1}{p}rect\left(\frac{x-\frac{p}{2}}{s}\right)\otimes comb\left(\frac{x}{p}\right),$$

$$p=s+w$$

where p=pitch, s =space width, and w =line width.

From Fourier optics, the electric field transmitted by the mask forms a distribution in the pupil plane, which is proportional to the mask spectrum. The field for a point source is given by equation (3) and the intensity is given by equation (4):

$$E(x)=F^{-}[P(f_x)F(t(x))] \quad (3)$$

$$I(x)=E(x)E\cdot(x) \quad (4)$$

where t(x) is the amplitude transmittance function and F (t(x)) is the mask spectrum that directly contributes to the electric field. F is the Fourier transform operator, $F^{-}$is the inverse transform operator, P is the pupil function, $f_x$ is the pupil frequency coordinate, E is the electric field, and I is the intensity at the image plane. Taking the Fourier transform of equation (2), the result is:

$$F\{m(x)\} = \frac{1}{p}\left\{\left[\left(s\frac{\sin(\pi k_x S)}{\pi k_x S}\right)\right] - \left[b\frac{\sin(\pi k_x w)}{\pi k_x w} * \exp(-\pi j k_x p)\right]\right\} * \sum_{-\infty}^{\infty}\delta\left(k_x - \frac{n}{p}\right) \quad (5)$$

$$p\sin(\theta) = n\lambda, \quad k_x = \sin(\theta)$$

$$0th \text{ order}, \quad n = 0, \quad k_x = 0 \quad \Rightarrow \quad (6)$$

$$F_0(k_x) = \frac{1}{p}\left(s - w\sqrt{T}\right) = \frac{1}{p}\left[p - w\left(1 + \sqrt{T}\right)\right]$$

$$\pm 1 \text{ order}, \quad n = 1, \quad k_x = \frac{1}{p} \quad \Rightarrow \quad (7)$$

$$F_1(k_x) = \frac{1}{\pi}\left[\sin\left(\frac{\pi s}{p}\right) + \sqrt{T}\sin\left(\frac{\pi w}{p}\right)\right] = \frac{1}{\pi}\sin\left(\frac{\pi w}{p}\right)\left(1 + \sqrt{T}\right)$$

Equation (6) indicates that the $0^{th}$ order amplitude decreases as the mask intensity transmittance increases. Equation (7) indicates that the $1^{st}$ order amplitude increases as the mask intensity transmittance increases. As such, it is clear that modifying the mask transmission changes the amplitude of the diffraction orders, thereby having a significant impact on the image quality. It is noted that for 100% transmission and a 1:1 line to space ratio, the $0^{th}$ order component is not present.

A comparison of mask spectra for bright intensity binary mask (BIM), CPL mask, 6% Att-PSM mask, and alternating phase shift mask (Alt-PSM) is summarized in Table 1.

TABLE 1

| Mask type | 0th Order | $1^{st}$ Order | Comment |
|---|---|---|---|
| BIM (bright field) | $1 - \frac{w}{p}$ | $\frac{1}{\pi}\sin\left(\frac{\pi w}{P}\right)$ | L is the line width, p is the pitch<br>0th order present from 1:1 |
| CPL | $\left(1 - \frac{2w}{p}\right)$ | $\frac{2}{\pi}\sin\left(\frac{\pi w}{p}\right)$ | No $0^{th}$ order for 1:1 line space ratio |
| 6% Att-PSM | $\left(1 - \frac{1.24\ w}{p}\right)$ | $\frac{1.24}{\pi}\sin\left(\frac{\pi w}{p}\right)$ | Lower $0^{th}$ order and higher $1^{st}$ order comparing with BIM |
| Alt-PSM | $e^{\frac{j\phi}{2}}\cos\left(\frac{\phi}{2}\right)$ | $\frac{2}{\pi}\sin\left(\frac{\pi w}{2P}\right)$ | When $\phi = \pi$, No $0^{th}$ order for all pitch |

As is clear from Table 1, by varying the transmission percentage of the mask features, it is possible to vary/control the amplitude of the diffraction orders captured by the projection pupil of the imaging system. As such, because the amplitude of the captured diffraction orders effects image quality, it is possible to adjust/improve image quality by controlling the transmission percentage of the mask features.

FIGS. 2(*a*)-2(*j*) illustrate how the diffraction orders captured by the projection pupil vary in accordance with varying transmission percentages for the mask features, and in particular, the simulation results of a process utilizing an KrF, 0.8 NA exposure tool with QUASAR™ illumination with $\sigma_o$=0.92, $\sigma_i$=0.72, and pole angle θ=30 degrees. More specifically, FIGS. 2(*a*)-2(*e*) illustrate plots of amplitude versus diffraction order that represent Fourier transforms of an exemplary mask feature of an 80 nm line at 220 nm pitch for mask transmission values of 0%, 6%, 25%, 35% and 100%, respectively. FIGS. 2(*f*)-2(*j*) show the 2-dimensional overlap of the diffraction orders captured by the projection pupil for the same line/space pattern with 0%, 6%, 25%, 35% and 100% transmission, respectively. As noted, equations (6) and (7) predict that as the mask transmission increases, the amplitude of the $\pm 1^{st}$ orders increase and the $0^{th}$ order decreases. The simulation results set forth in FIGS. 2(*a*)-2(*j*) confirm this conclusion.

Figure 3:
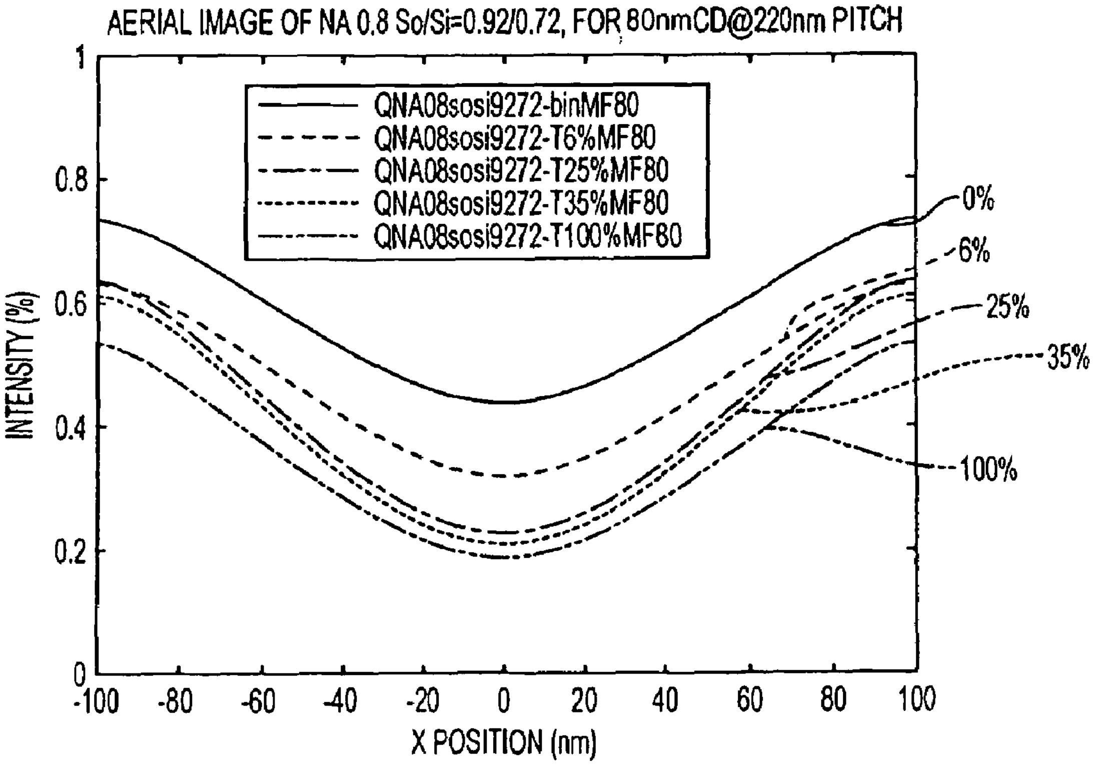
FIG. 3 illustrates the resulting aerial image intensity for 80 nm lines at a pitch of 220 nm for 0.8 NA KrF, QUASAR™, $\sigma_{out}$=0.92, $\sigma_{in}$=0.72 and θ=30 degrees.

Assuming vector-unpolarized light is utilized in the foregoing example, FIG. 3 illustrates the corresponding aerial image intensity at the image plane for each transmission value illustrated in FIGS. 2(*a*)-2(*j*). FIG. 3 also illustrates that utilizing mask features having a 35% transmission, results in the highest normalized image log slope (NILS), and therefore the best image contrast. The results of the NILS calculation for the various transmissions are summarized in Table 2. As indicated, 35% mask transmission results in the highest NILS value. It is noted that methods for computing NILS are well known by those skilled in the art, and therefore are not further discussed herein.

TABLE 2

| Intensity Transmission | NILS |
|---|---|
| Bin | 0.67 |
| 6% | 0.91 |
| 25% | 1.14 |
| 35% | 1.2 |
| 100% | 1.15 |

Figure 4A:
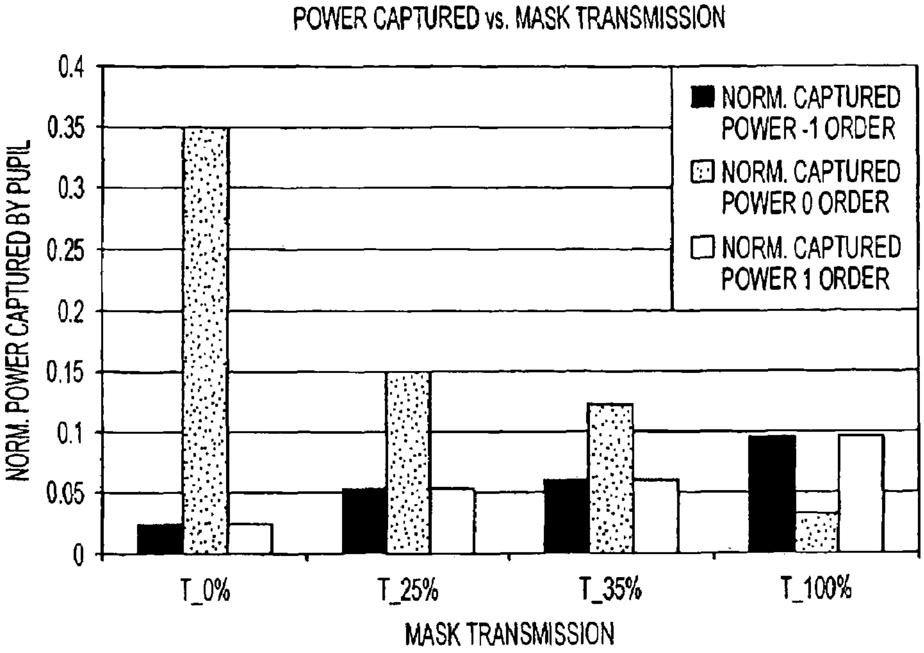
FIG. 4(*a*) illustrates the normalized power captured by the pupil for the $0^{th}$ and +/−$1^{st}$ diffraction orders in the given example.

FIGS. 2(*a*)-2(*j*) also illustrate that as an attempt is made to resolve smaller pitches, not all of the $1^{st}$ diffraction orders are captured by the projection pupil, and therefore, not all of the first order light contributes to image formation. Clearly, varying the mask transmission percentage alters the ratio between $0^{th}$ and $1^{st}$ diffraction order amplitudes, and therefore, impacts the interference between the two diffraction orders. In order to properly account for the portion of the $\pm 1^{st}$ order that generates the maximum interference, the energy transmitted by the diffraction orders needs to be calculated. FIG. 4*a* shows that for 35% transmission, the sum of the $\pm 1^{st}$ order captured in the projection pupil is equal to the total of the $0^{th}$ order. Further, it has been determined that this situation, where the $\pm 1^{st}$ order captured in the projection pupil is equal to the total of the $0^{th}$ order, provides the most balanced intensity distribution in the projection pupil, which results in the optimal transmission and image contrast for the given pitch and illumination settings. It is noted that calculations set forth in FIG. 4(*a*) are based on the same example as discussed above (i.e., 80 nm lines at a pitch of 220 nm, with the same illumination settings as utilized in conjunction with FIG. 3).

Figure 4B:
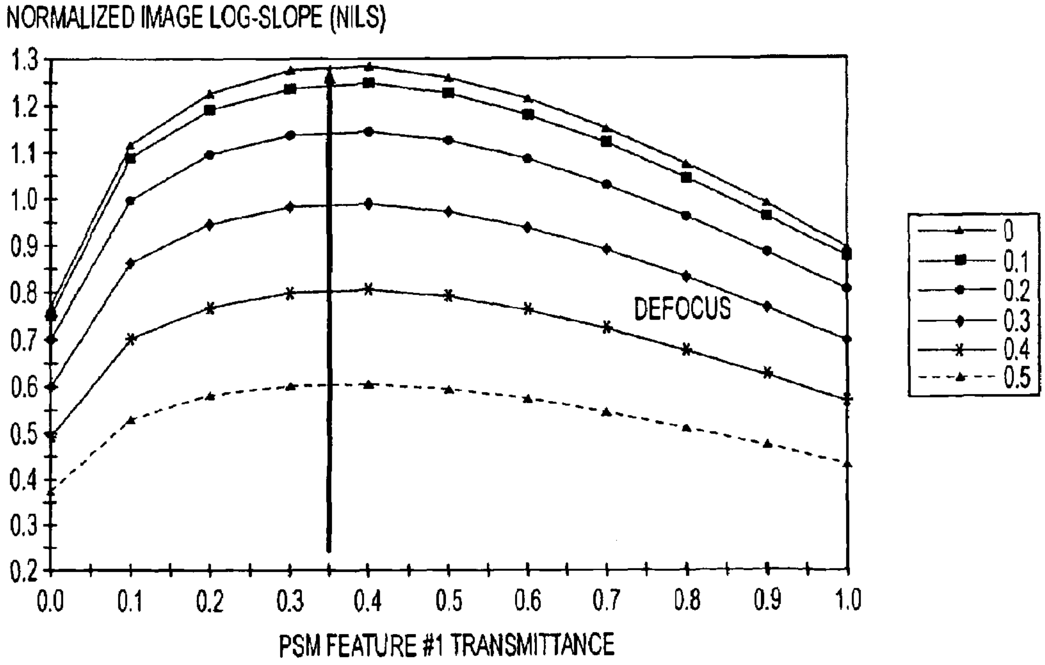

In an effort to verify that utilizing mask features having a 35% transmission is the best transmission for the foregoing example of 80 nm lines at a 220 nm pitch at the specified illumination setting, an additional simulation was performed utilizing Prolith v7.1 using the vector unpolarized simulation setting. As noted above, NILS is directly related to image contrast, and the higher the NILS, the better the image contrast, which directly translates into improved exposure latitude. FIG. 4*b* illustrates the results of the additional simulation. Referring to FIG. 4*b*, the results confirm that 35% transmission for the mask features provides the highest NILS through focus. As shown, for each of the defocus conditions under test, the maximum NILS occurred at 35% transmission.

Figure 5A:
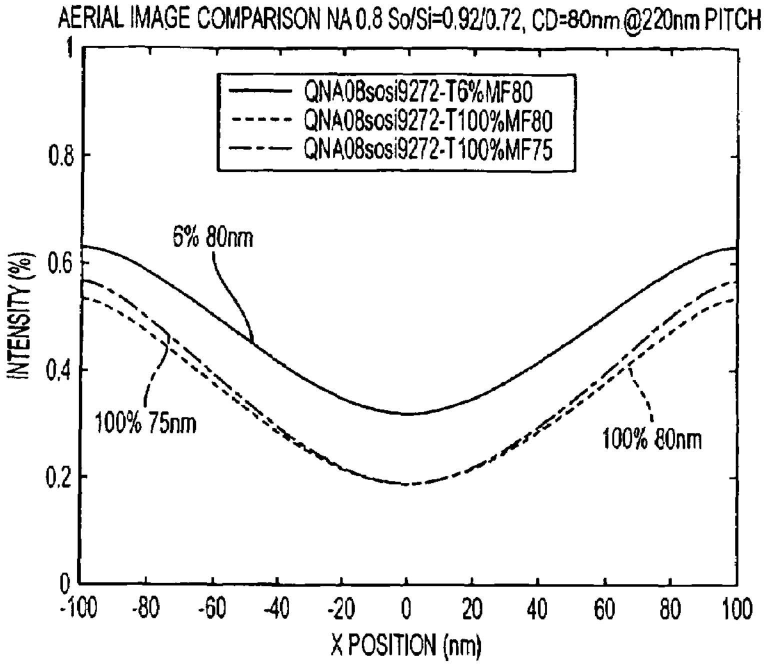
FIG. 5(*a*) illustrates an aerial image comparison for CPL and 6% Att-PSM for a mask design having a target CD of 80 nm.
Figure 5B:
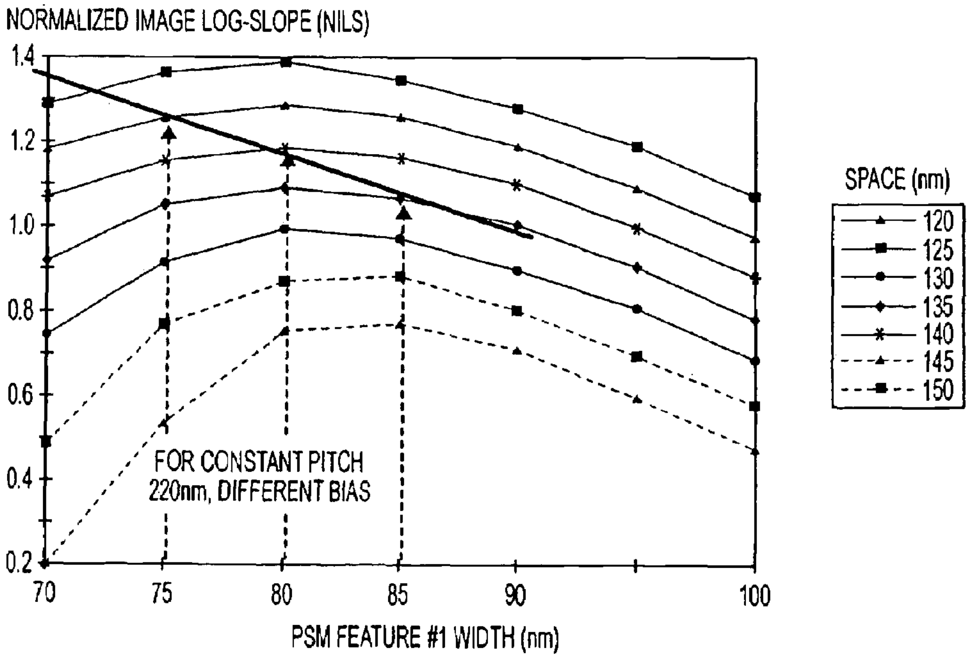

FIG. 5(*a*) illustrates a comparison of the resulting aerial image between CPL and 6% Att-PSM for 80 nm CD and 220 nm pitch lines on the mask. As shown, CPL (100% transmission) provides a lower minimum intensity. FIG. 5(*b*) illustrates that for the CPL mask, negatively biasing the mask line width to 75 nm further improves the image sharpness and produces a higher NILS. The negative bias operates to increase the $0^{th}$ order producing better contrast for dense CPL features.

Figure 6A:
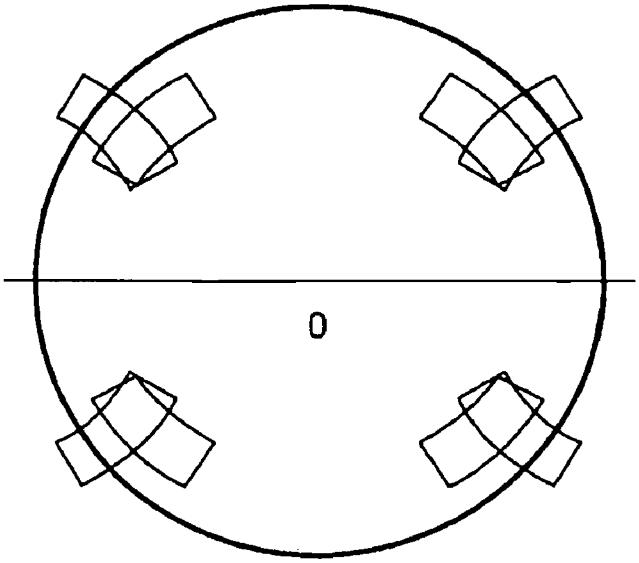
FIG. 6(*a*) illustrates the projection pupil corresponding to mask features having 90 nm line at a pitch of 240 nm, and a 35% transmittance.
Figure 6B:
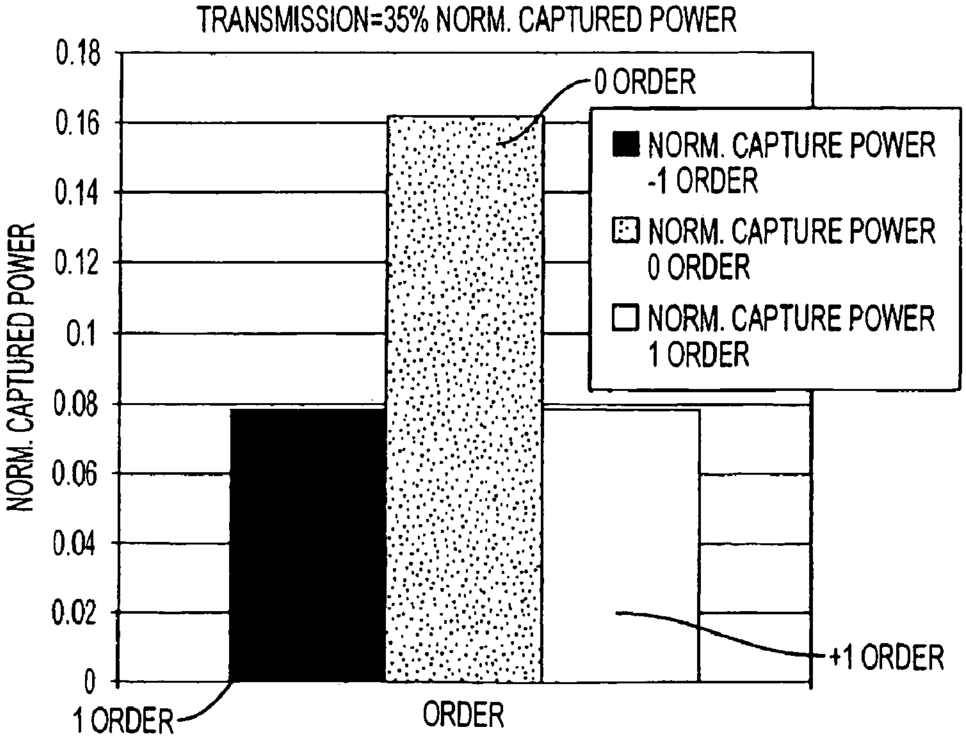

It has been shown above that by varying the transmission percentage of the mask features, it is possible to optimize the resulting image contrast for a given line:space pattern for a given illumination condition. However, it is also possible to optimize the process latitude by controlling the transmission percentage of the mask features. In order to illustrate this principle, focus-exposure matrices (FEMs) were computed for the following six transmission percentages: 0%, 6%, 25%, 35%, and 100%. The same KrF 0.8 NA and QUASAR™ illumination conditions as set forth in the foregoing example were utilized again. The illumination was optimized for 240 nm pitch, as shown in FIG. 6(*a*), and once again, utilizing a 35% transmission, the same optimized $\pm 1^{st}$ to $0^{th}$ order ratio is obtained as shown in FIG. 6(*b*).

Figure 7A:
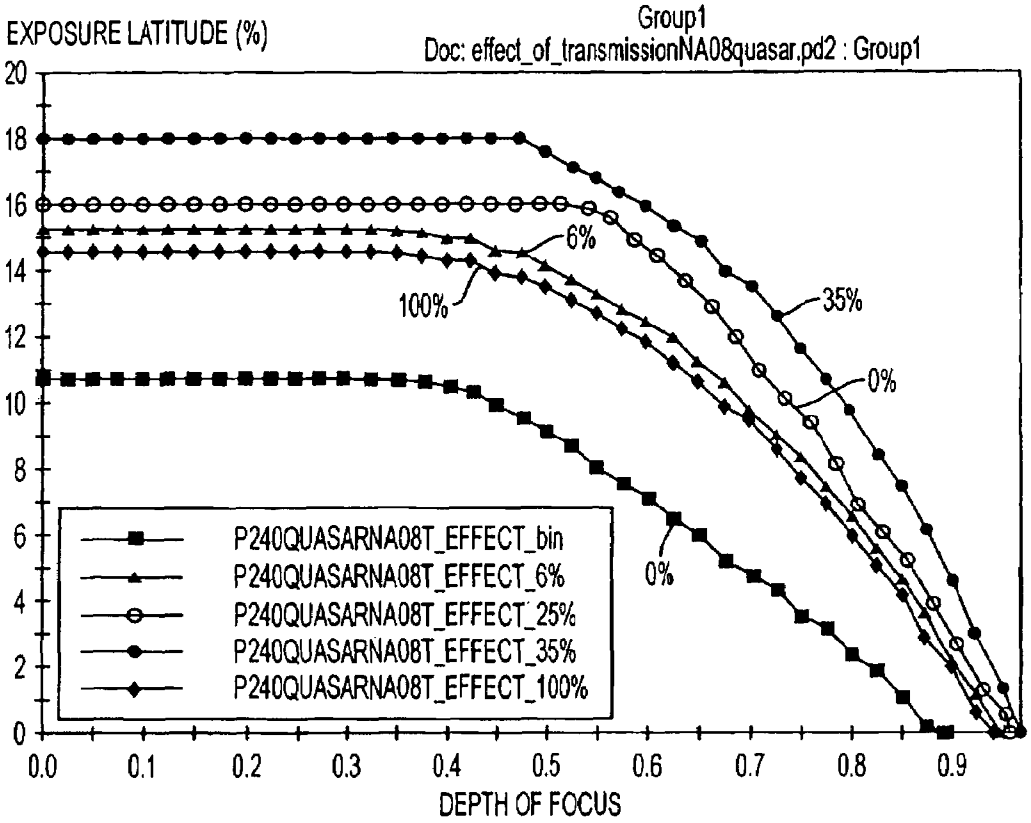
FIGS. 7(*a*) and 7(*b*) illustrate the effect of varying the transmission percentage of the mask features on exposure latitude (EL) versus depth of focus (DOF).
Figure 7B:
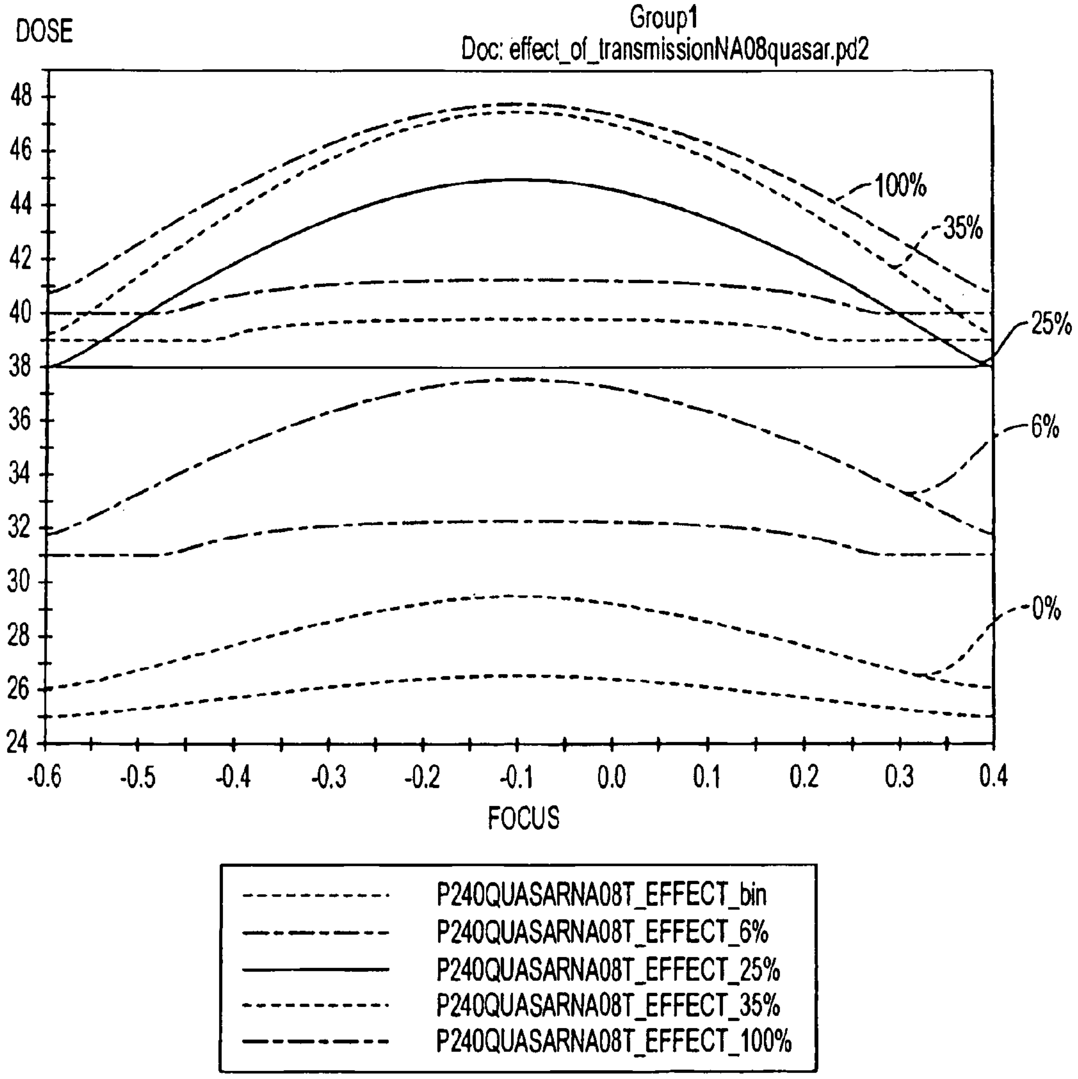

FIGS. 7(*a*) and 7(*b*) illustrate the effect of varying the transmission percentage of the mask features on exposure latitude (EL) versus depth of focus (DOF). In particular, FIG. 7(*a*) illustrates the FEM matrices for the 0%, 6%, 25%, 35%, and 100% transmissions, and FIG. 7(*b*) illustrates the corresponding process windows. Upon reviewing FIGS. 7(*a*) and 7(*b*), it is evident that 35% transmission provides the optimal exposure-dose latitude. More specifically, referring to FIG. 7(*a*), for a 90 nm printed CD on the wafer, the 35% transmission results in a 0.6 micron DOF at 16% exposure-latitude. FIG. 7(*b*) illustrates that as the transmission percentage increases, the minimum intensity becomes lower (see also, FIG. 3). As such, for the same target CD, increased dose is required. The trend of increasing dose with increasing transmission is clearly shown in FIG. 7(*b*). It is noted that 0% transmission (i.e., Cr) exhibits the highest minimum intensity level. As such, in order to achieve the same printed CD, the 0% transmission case needs to utilize the highest printing threshold and the lowest exposure energy.

Next, it is described how transmission tuning of the mask features can be utilized to affect the mask error factor (MEF). Mask error factor (MEF) or the mask error enhancement factor (MEEF) is defined as the ratio of the change in resist feature size to the change in mask feature size scaled by the magnification of the exposure tool, and is given by:

$$MEEF = \frac{\partial CD}{\partial ReticleCD / M} \tag{8}$$

where M is the exposure tool reduction factor. Lithography process variables such as focus, lens aberrations, line width, mask tone, optical proximity correction (OPC), resist contrast and resist thickness, among other factors, all have an impact on the MEEF factor.

Figure 8:
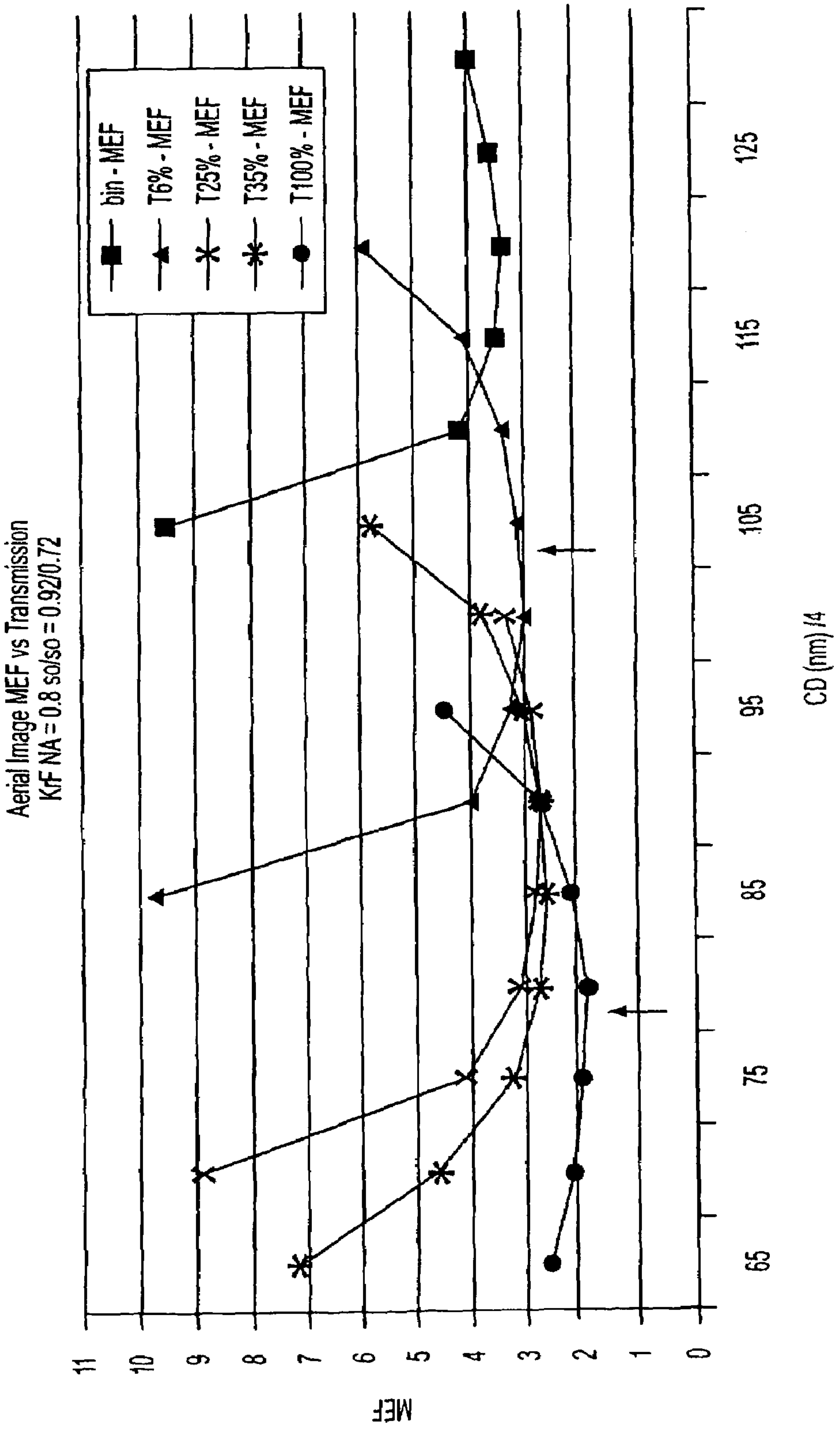
FIG. 8 illustrates the simulated image MEEF as a function of reticle CD at 1X for a target CD of 90 nm at a 220 nm pitch for the given example.

As explained above, for a given CD (i.e., line width) and pitch, changing the mask transmission or bias will impact image quality. As the image contrast changes, the printed contour also changes. In turn, this impacts the MEEF. FIG. 8 illustrates the simulated image MEEF as a function of reticle CD at 1X for a target CD of 90 nm at a 220 nm pitch utilizing the same illumination settings as set forth in the example discussed above (i.e., using a KrF NA=0.8; sigma out=0.92; sigma in=0.72, and angle=30 degrees QUASAR™ illumination). Typically, the higher the image contrast, the lower the MEEF. Referring to FIG. 8, it is shown that an 80 nm CPL (100% transmission, π-phase) feature has better image contrast than the corresponding 6% Att-PSM feature. Under the same conditions, the MEEF for CPL (100% transmission) is 2 for a printed resist CD of 80 nm, while for 6% the MEEF is greater than 10. As the mask transmission increases above 25%, a negative bias is required to achieve the lowest MEEF. The feature CD corresponding to the minimum MEEF decreases as transmission is increased. For a 90 nm printed CD target on the wafer, CPL requires a 15 nm negative bias to provide the lowest MEEF. As such, it is clear that MEEF is a strong function of feature bias and mask transmission, which is understandable as both feature bias and mask transmission change the ratio of $0^{th}$ and $\pm 1^{st}$ diffraction order amplitudes and the energy captured by the pupil.

Figure 9:
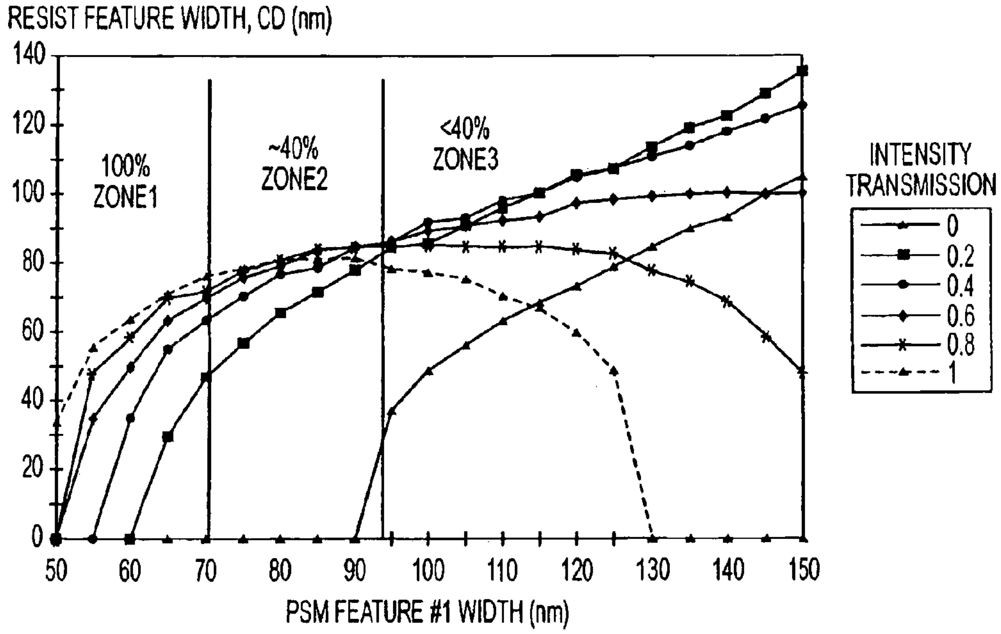
FIG. 9 illustrates the behavior of the simulated CD through size as a function of mask intensity transmission for the given example.

Transmission tuning also effects the mask CD (critical dimension) linearity. FIG. 9 illustrates the behavior of the simulated CD through size as a function of mask intensity transmission utilizing the same settings as the example set forth above, the target CD is 90 nm on the wafer with a 220 nm pitch. FIG. 9 illustrates that for CDs smaller than 70 nm, utilizing CPL (i.e., 100% transmission, π-phase) to form the mask features is the best approach, as CPL exhibits the best resolution and linear behavior. As the target CD approaches 80 nm or more, the light begins to leak through the two phase-edges forming the target line in Zone 1, and as a result, in the given example CPL is not suitable for a CD larger than 80 nm. Referring again to FIG. 9, for target CDs in the range between 75 nm and 95 nm a transmission from 35% to 40% provides the best linear behavior. It is noted that the percentage transmission of a given feature can be controlled by halftoning the feature. This entails, for example, forming a line feature by applying a plurality of chrome patches which are spaced apart from one another, but when imaged, produce the target line. The transmission percentage can be varied by controlling the size of the chrome patches and the space between chrome patches. The foregoing "halftoning" technique is described in detail in U.S. patent application Ser. No. 10/659,715 filed on Sep. 11, 2003, which is incorporated by reference herein in its entirety. Returning to FIG. 9, for target CDs larger than 95 nm, 0% transmission features (e.g., solid chrome features) provide the best linear behavior. It is noted that the region containing target CDs that are capable of utilizing 100% transmission is referred to as Zone 1, the region containing target CDs that are capable of utilizing halftoning is referred to as Zone 2, and the region containing target CDs that utilizes 0% transmission is referred to as Zone 3.

It is well known that as $k_1$, becomes lower, optical proximity effects caused by the interaction between the features of interest and the neighboring structures becomes much more severe. At a given NA setting, such optical interactions not only effect the critical dimension, but also impact the exposure latitude of the feature. It has been shown (see, U.S. Pat. No. 6,792,591) that for processes and designs, "forbidden pitch" regions exist in which the exposure latitude is very poor. For such forbidden pitches that are large enough to insert assist features, the exposure latitude can be improved. However, at the forbidden pitch where there is insufficient space for inserting the assist features, the through pitch process latitude is limited by the "forbidden pitch" as the name suggests, due to the fact that prior to the present invention, mask designers would simply design the mask such that no features fall within the forbidden pitch region. In other words, no forbidden pitch was utilized in the mask design, which significantly degraded overall process latitude. In the present invention, the transmission tuning technique detailed above is utilized to optimize the imaging performance of features within the forbidden pitch region so as to improve the overall process latitude. Indeed, as is shown below, the transmission tuning of the present invention is utilized to "tune" the features within the forbidden pitch region so as to improve the imaging performance of features within the forbidden pitch, thereby eliminating the need to avoid the forbidden pitch region in the mask design, and the associated degradation in process latitude. It is noted that "forbidden pitch" as referred to herein is not limited to a specific pitch, but also includes a range around the specific pitch identified as the forbidden pitch. As such, all features within the forbidden pitch range could have the transmission tuning of the present invention applied thereto. The range of the forbidden pitch would be dependent on the given process and illumination setting being utilized, and can be defined by the designer during the tuning process by examining the NILS plot through pitch as explained in further detail below, or as another example, can be set as a predefined range about a given pitch.

Figure 10:
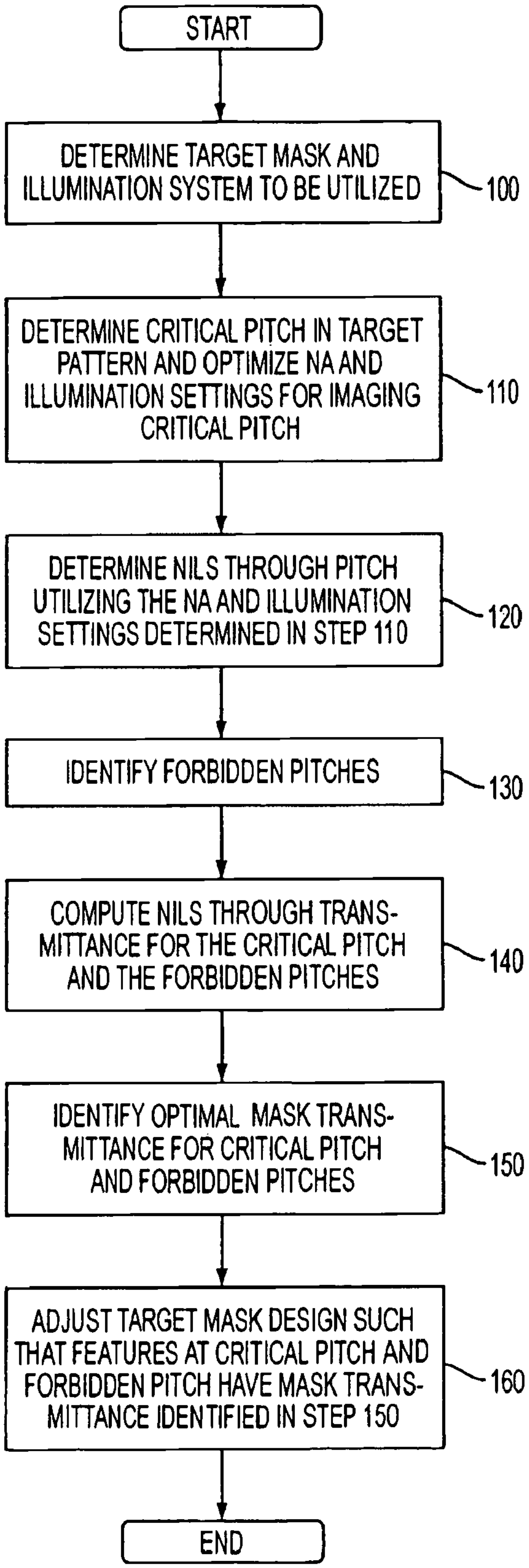
FIG. 10 is a flowchart setting forth an exemplary method of practicing the present invention.

FIG. 10 is a flowchart setting forth an exemplary method of practicing the present invention. The first step in the process (Step 100) is to determine/obtain a target mask pattern and the illumination system that will be utilized to perform the given process. The next step in the process (Step 110) is to identify a critical pitch in the target pattern and optimize the illumination conditions for printing the target pattern. Typically, the critical pitch corresponds to the most dense pitch (i.e., smallest pitch) contained in the target pattern. However, it is also possible to utilize another pitch as the critical pitch, for example, if a majority of the features in the target pattern are at a pitch other than the densest pitch, the designer may decide to optimize the illumination conditions at the majority pitch.

Figure 11:
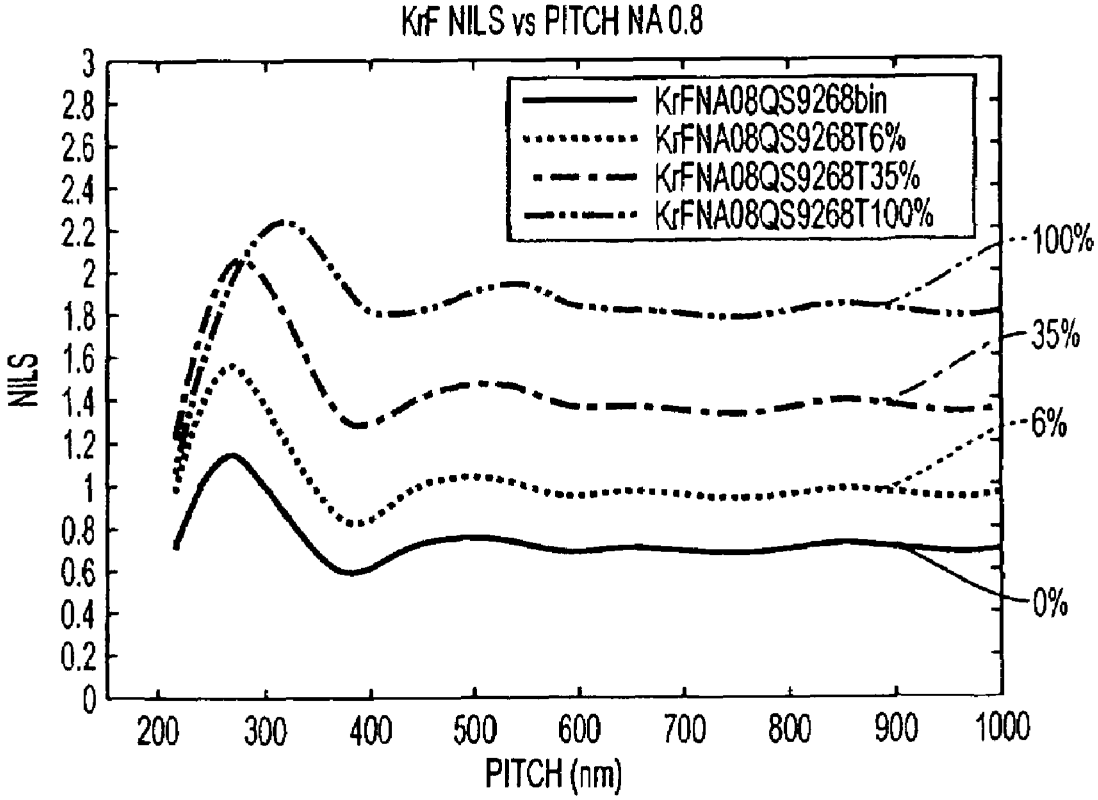
FIG. 11 is a plot illustrating NILS through pitch for the given example.

Once the optimal illumination settings are determined for the critical pitch, the next step (Step 120) is to determine the NILS through pitch utilizing the illumination settings defined in Step 110, in the same manner as discussed above. As noted above, by determining NILS through pitch, it is possible to determine the "forbidden pitches" for the given illumination process, which is the next step in the process (Step 130). Referring to FIG. 11, and as discussed further below, by reviewing the NILS plot through pitch, the pitches that exhibit lower imaging quality (i.e., forbidden pitch) are easily identified as those pitches having the lowest NILS value. In FIG. 11, it is seen that in the given example, 390 m corresponds to a forbidden pitch, and the area around the 390 nm pitch (e.g., +/−10 um) would correspond to the forbidden pitch region as these pitches also exhibit reduced imaging performance as can be seen by FIG. 11. As noted above, upon analyzing the NILS through pitch plot, the designer can, for example, determine how large the forbidden pitch region should be by identifying the width of the trough of the NILS plot about the forbidden pitch, thereby determining the pitches within the mask design that will be subjected to the transmission tuning. Alternatively, it is possible to predefine the range about each forbidden pitch that would be deemed to be included in the forbidden pitch region. It is further noted that it is also possible to utilize the transmission tuning process of the present invention to optimize the imaging performance of features having pitches outside of the forbidden pitch region.

Once the forbidden pitches are identified, the next step (Step 140) in the process is to determine/compute the NILS through transmittance (i.e., % transmission) for the critical pitch and for each of the forbidden pitches, in the event that more than one forbidden pitch is identified in Step 130. It is noted that it is also possible to compute the NILS through transmittance for additional pitches not identified as forbidden pitches, in the event the designer desires to optimize additional pitches within the target design. It is further noted that the same illumination conditions as determined in Step 110 are utilized in computing the NILS plots of Step 120 and Step 140.

By computing the NILS through transmittance for the critical pitch and the forbidden pitch(es), it is readily discernable what the optimal transmittance (i.e., % transmission) should be for the critical pitch and the forbidden pitch(es) to produce the best imaging results (Step 150). Indeed, as described above, the highest NILS value corresponds to the optimal transmission. It is noted that the optimal transmission for the critical pitch and the forbidden pitch(es) can be different from one another.

Once the optimal transmission percentages have been identified for both the critical pitch and the forbidden pitch, the final step in the process (Step 160) is to adjust the features in the target design at the critical pitch and at the forbidden pitch(es) to the transmission percentages identified in Step 150. As explained in more detail below, there are different techniques for adjusting the transmission percentage of a given feature, for example, halftoning the feature. It is also noted that various NILS computations set forth in the foregoing process are preferably conducted by simulators, such as for example, ASML MaskTools, Lithocruiser software package.

An example of the foregoing method is now described. The illumination settings utilized in the example are for a KrF system with 0.8 NA, QUASAR™ illumination, $\sigma_{out}$=0.92, $\sigma_{in}$=0.68, and θ=30 degrees. The target mask comprises 80 nm lines at a 240 nm pitch. In this example, the critical pitch is 240 nm. The next step is to generate a plot of NILS through pitch utilizing the foregoing illumination settings and target mask. FIG. 11 illustrates the result of the NILS plot. It is noted that in the given example the NILS is plotted through pitch for four different mask transmissions, which are 0%, 6%, 35% and 100%. However, it is also possible to select a single transmission and plot NILS through pitch for the single transmission to identify the forbidden pitch. Referring to FIG. 11, it can be seen that there is a forbidden pitch at approximately 390 nm, as there is a sharp drop in the NILS value for each transmittance at this pitch. As such, 390 nm is the weakest pitch (i.e., forbidden pitch) in terms of exposure latitude.

Figure 12A:
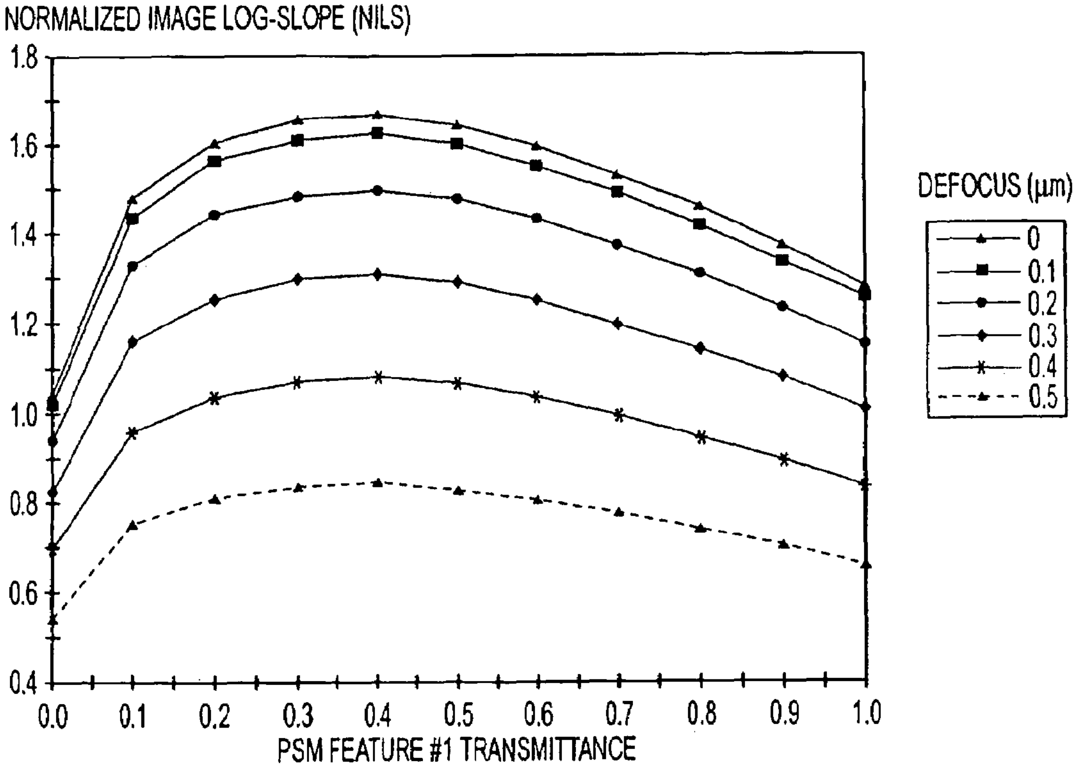
FIGS. 12(*a*) and 12(*b*) illustrate the plot of NILS through transmittance for the 240 nm critical pitch and the 390 nm forbidden pitch, respectively.
Figure 12B:
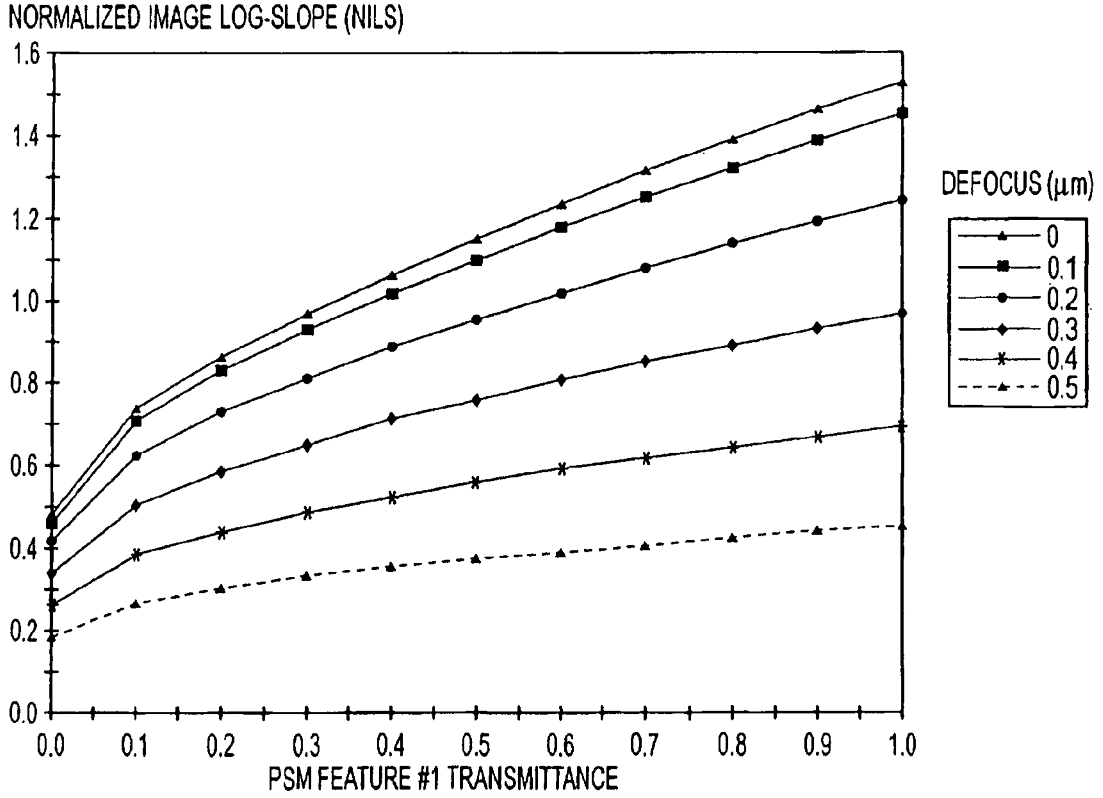

FIGS. 12(*a*) and 12(*b*) illustrate the results of the next step in the process, which is to compute the NILS through transmittance for the critical pitch (i.e., 240 nm) and the forbidden pitch (i.e., 390 nm). It is preferable to compute the NILS through transmittance for various focus settings. Referring to FIG. 12(*a*), it is shown that the best transmittance at each defocus setting for the 240 nm feature is approximately 35% transmission (i.e., the highest NILS value corresponds to the best image contrast). Referring to FIG. 12(*b*) it is shown that the best transmittance at each defocus setting for the 390 nm forbidden pitch is 100% transmission. It is noted that it is possible to utilize a single defocus setting when computing NILS through transmittance for the forbidden pitch. However, by utilizing multiple defocus settings it is possible to confirm that a given transmittance is optimal over a given defocus range.

As the final step in the process, the features contained in the target pattern at a pitch of 240 nm are modified to have a transmittance of 35%, while the features contained in the target pattern at a pitch of 390 nm are modified to have a transmittance of 100%. The modified mask is then utilized to image the actual wafer.

Figure 13A:
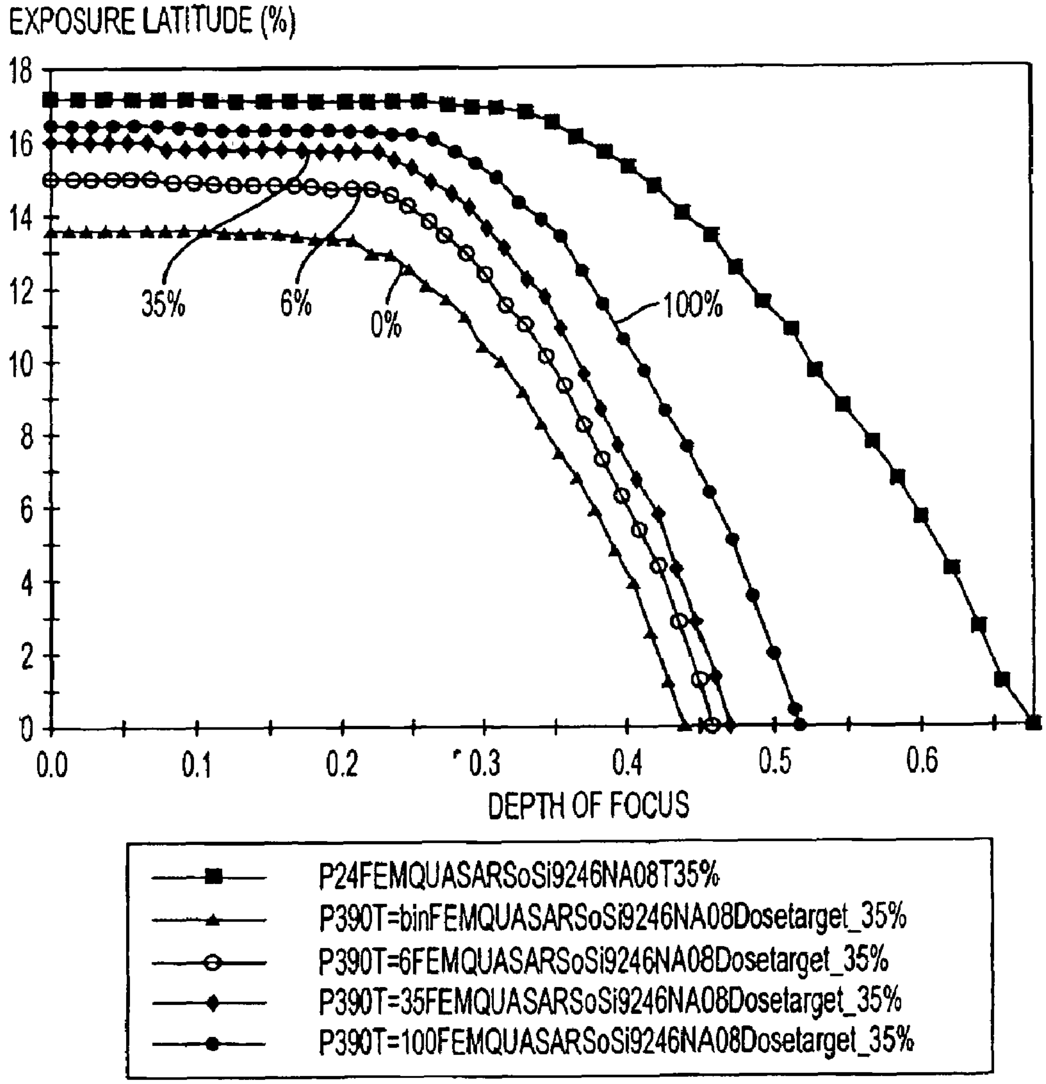
FIGS. 13(*a*) and 13(*b*) illustrate the exposure latitude versus defocus plot and the overlapped process window, respectively, for the given example.
Figure 13B:
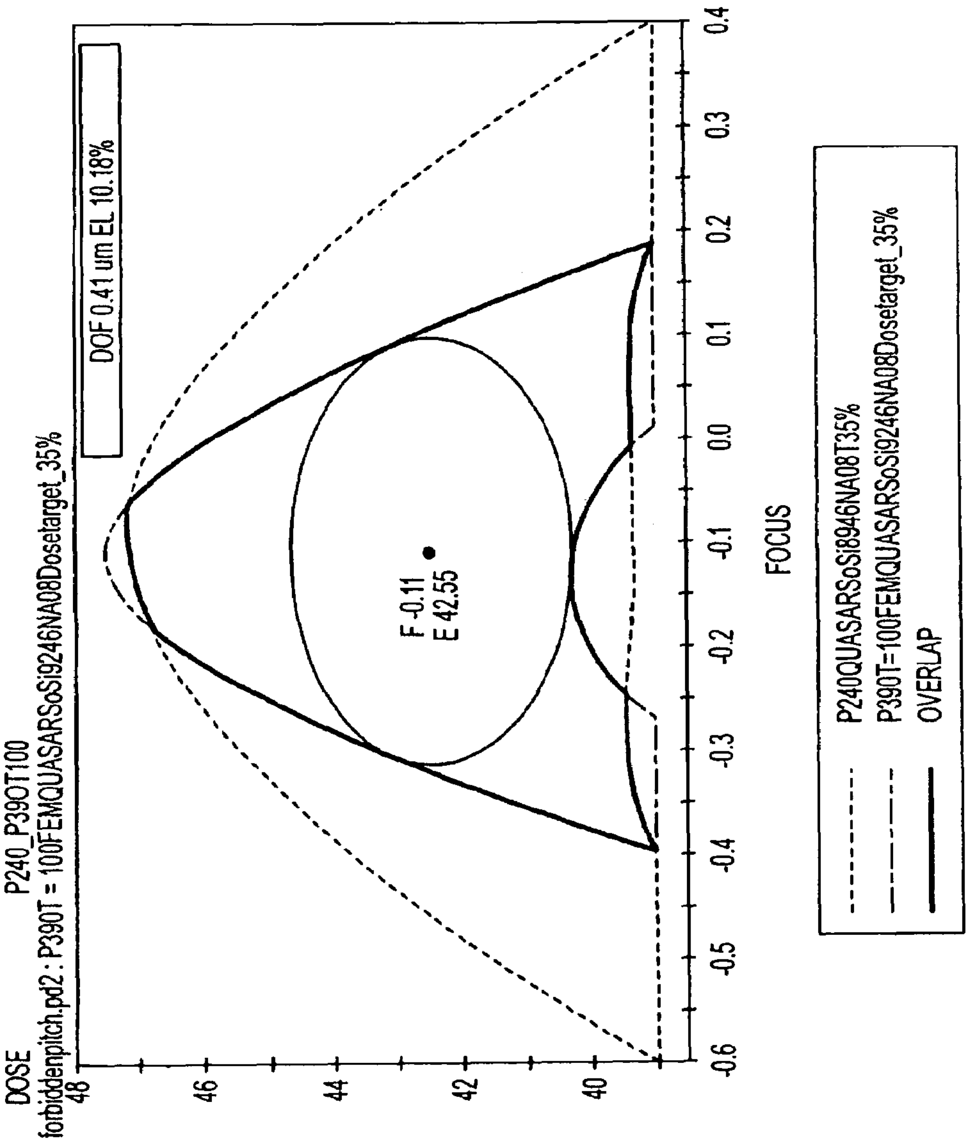

FIGS. 13(*a*) and 13(*b*) are exposure latitude plots, which illustrate that the foregoing process of the present invention operates to improve the overall exposure latitude of the process. FIG. 13(*a*) is a exposure latitude versus focus plot which confirms that 100% transmission provides the best ED latitude for the 390 nm features. FIG. 13(*b*) shows the overlapped process window for 240 nm pitch with 35% transmission and the 390 nm pitch with 100% transmission. By properly optimizing the transmission for the 390 nm forbidden pitch, it is demonstrated that a 0.4 um DOF @10% exposure latitude is achievable. This KrF example illustrates that transmission tuning can be used to overcome the forbidden pitch problem.

Figure 14:
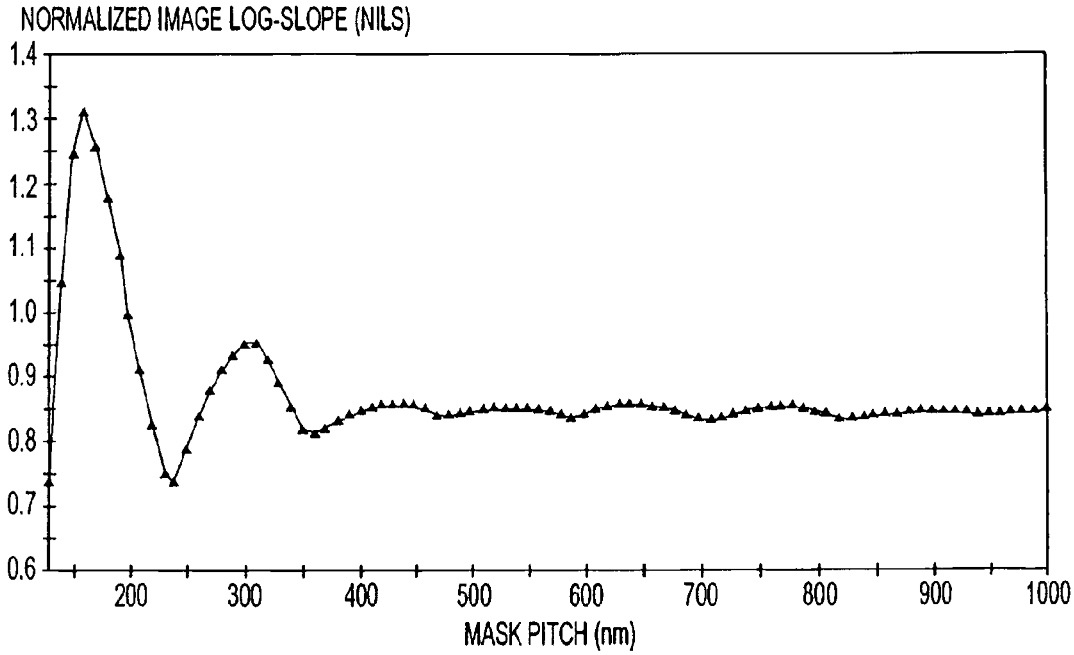
FIG. 14 is a plot illustrating NILS through pitch for an exemplary high NA, ArF system.

As noted above, the position of forbidden pitch is a strong function of NA. For a high NA ArF system, the forbidden pitch shifts to a smaller pitch where there is no space for applying assist features, such as scattering bars. FIG. 14 illustrates the simulated NILS though pitch using a 0.85NA ArF with x dipole illumination, $\sigma_{out}$=0.92, $\sigma_{in}$=0.68, and $\theta$=30 degrees, and utilizing a binary intensity mask having a critical pitch of 130 nm. As shown in FIG. 14, in comparison to the KrF example, the forbidden pitch range shifts to 200 nm to 250 nm pitch range. Currently, such pitch ranges are too small to allow for insertion of assist features to shift the energy to higher diffraction order to improve the image quality. However, applying the present invention to this case, it is possible to minimize the negative effects of the forbidden pitch.

Figure 15A:
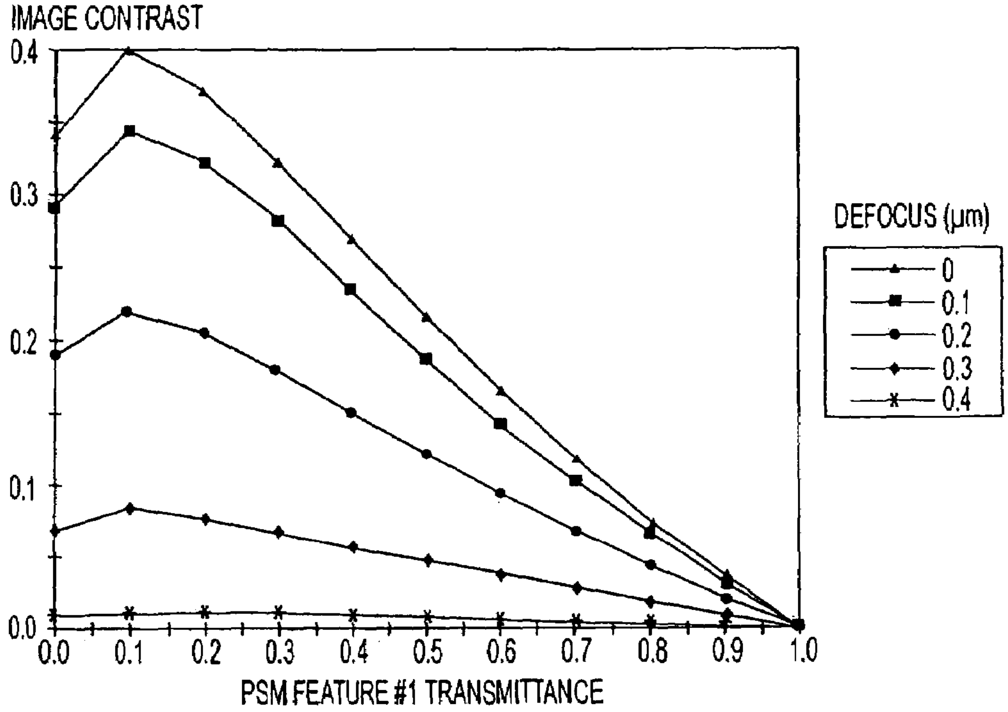
FIGS. 15(*a*) and 15(*b*) illustrate the plot of NILS through transmittance for the 130 nm critical pitch and the 200 nm forbidden pitch, respectively, for the given example.
Figure 15B:
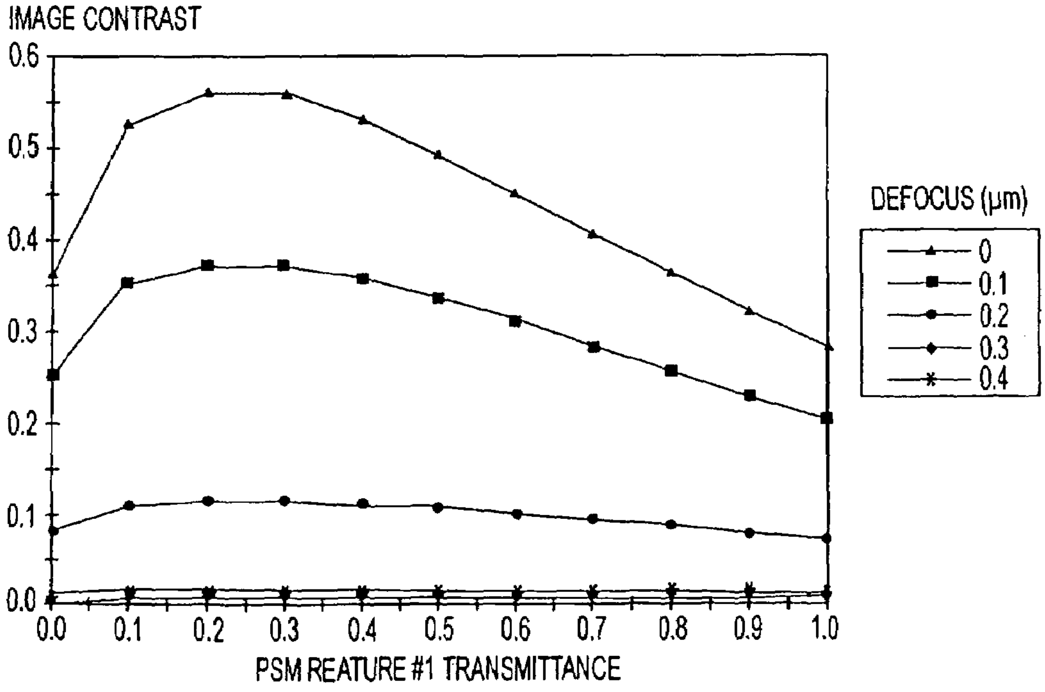

Specifically, as stated, FIG. 14 illustrates the NILS through pitch for the foregoing illumination conditions, and as shown, the forbidden pitch is in the 200-250 nm range. FIGS. 15(*a*) and 15(*b*) illustrates the NILS plots through transmittance for the 130 nm pitch (which in the given example is the critical pitch) and the 200 nm pitch, respectively, for various defocus settings. Referring to FIG. 15(*a*), it is shown that the optimal transmittance for the 130 nm pitch is 10% (i.e., the highest NILS value). Referring to FIG. 15(*b*), it is shown that the optimal transmittance for the 200 nm pitch is 20% (i.e., the highest NILS value).

In order to verify the improvement in process latitude, three FEMs using Binary mask, 10%, 20% and 40% transmissions, respectively, were run via a simulator with the dose optimized for resolving the 130 nm pitch. The result of the simulation is set forth FIGS. 16(*a*) and (*b*). As is clear from FIGS. 16(*a*) and (*b*), the 20% transmission of the features having a 200 nm pitch produces the best exposure-defocus (ED) latitude. More specifically, by setting the transmission of the features of the target pattern having a pitch of 200 nm at 20%, it is possible to achieve a 0.21 um DOF @ 10% exposure latitude. For the binary mask, only 0.18 um at 10% exposure is attainable. As such, a 16% DOF improvement can be realized for the 200 nm pitch by utilizing the transmission tuning method of the present invention.

Figures 17A, 17B, 17C:
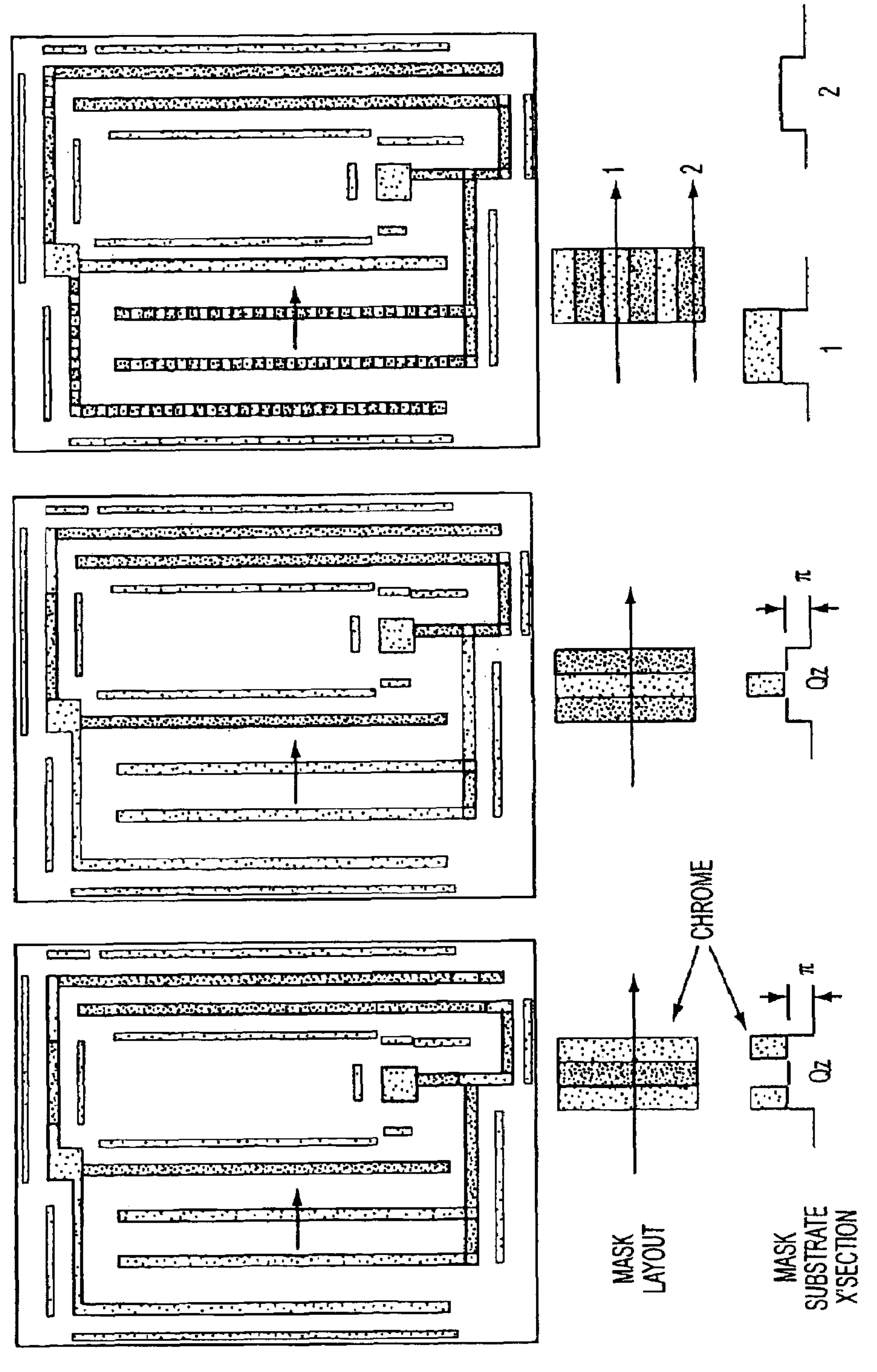
FIGS. 17(*a*)-17(*c*) illustrate exemplary methods of adjusting the transmittance of mask features.

Transmission tuning of the features can be implemented in a number of different ways. In each of the following examples, the main principle is that the original target feature, for example, a line, is modified such that the actual line set forth in the mask exhibits an increased transmission when compared to the original line in the target pattern. In other words, the original line would be deemed to have a 0% transmission (e.g., all chrome), whereas the modified lines having increased transmittance are modified to allow more light to pass therethrough. FIG. 17(*a*) illustrates a first method of transmission tuning referred to as the "stripe" method. This method entails removing the chrome in the center portion of a line as shown in FIG. 17(*a*). FIG. 17(*b*) illustrates a second method where the edges of a chrome line are etched to produce a center chrome patch on the top of a mesa structure. A third method, referred to as the "halftoning" method and illustrated in FIG. 17(*c*), entails etching the chrome line such that chrome and phase regions alternate like a "zebra" pattern. It is noted that the "halftoning" method has the highest write misalignment tolerance.

A number of experiments were performed to confirm the improvement in process latitude obtained by practicing the present invention, the results of which are set forth below. In the example, all of the exposures were performed with an ASML PAS 5500/1100 ArF scanner with 0.75 NA, dipole (35° opening angle, $\sigma_{in}$=0.65, $\sigma_{out}$=0.89) and QUASAR™ illumination (30° opening angle, $\sigma_{in}$=0.65, $\sigma_{out}$=0.89). The targeted print CD was 70 nm. For all experiments, wafers were coated with 150 nm of ARX1091 S on ARC29, developed with OPD 262. The wafers were coated on a TEL ACT track. CD metrology was done using a KLA-8450R SEM.

Figure 18A:
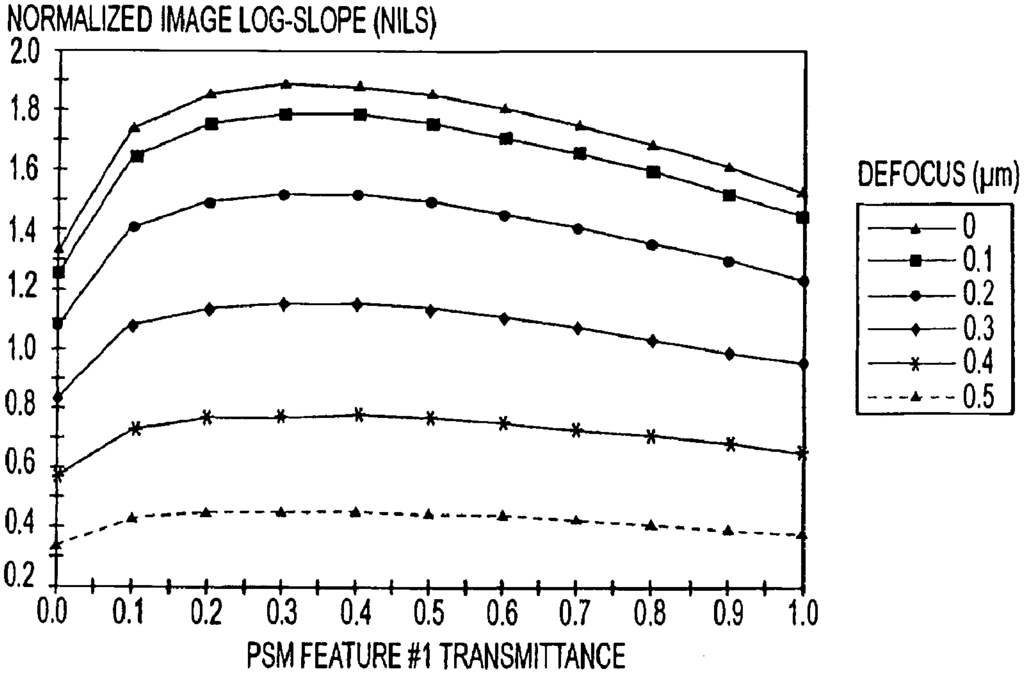
FIG. 18(*a*) is a plot illustrating NILS through pitch for the given example.
Figure 18B:
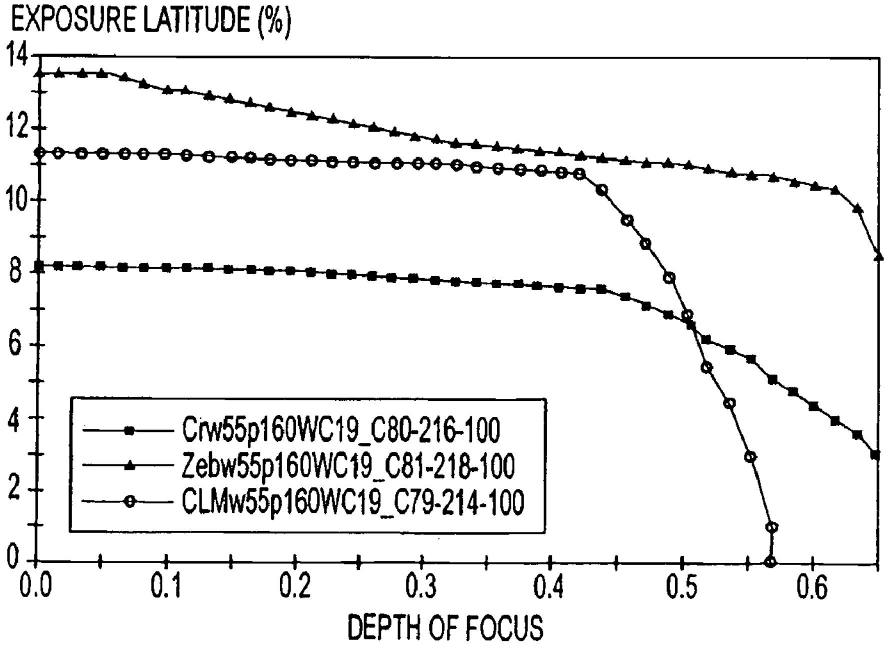
Figure 19A:
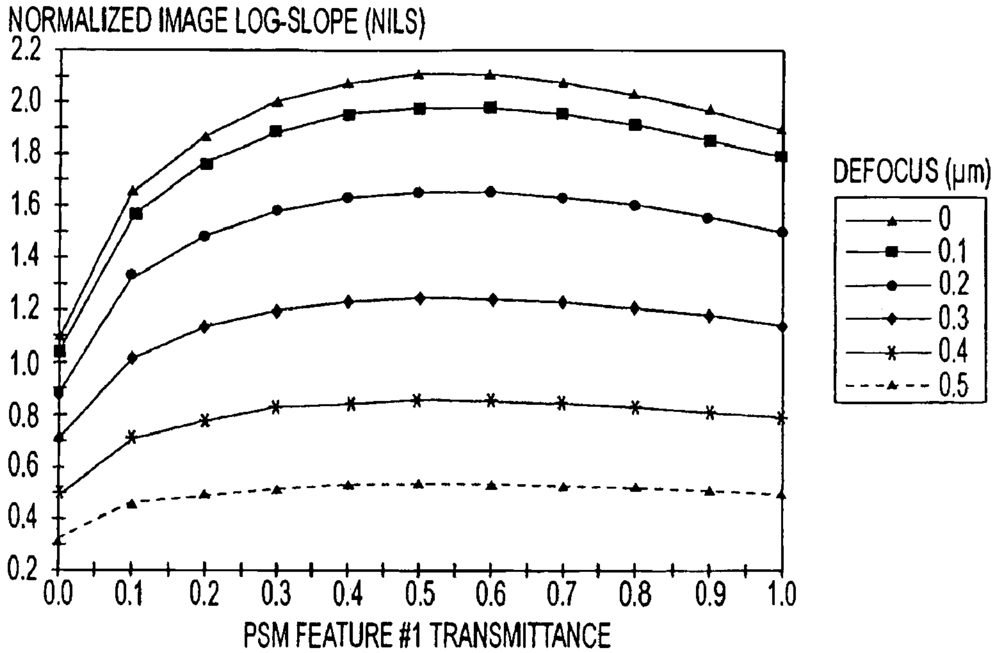
FIGS. 19(*a*)-19(*f*) illustrate experimental results confirming the improvement in process latitude obtainable by the present invention.
Figure 19B:
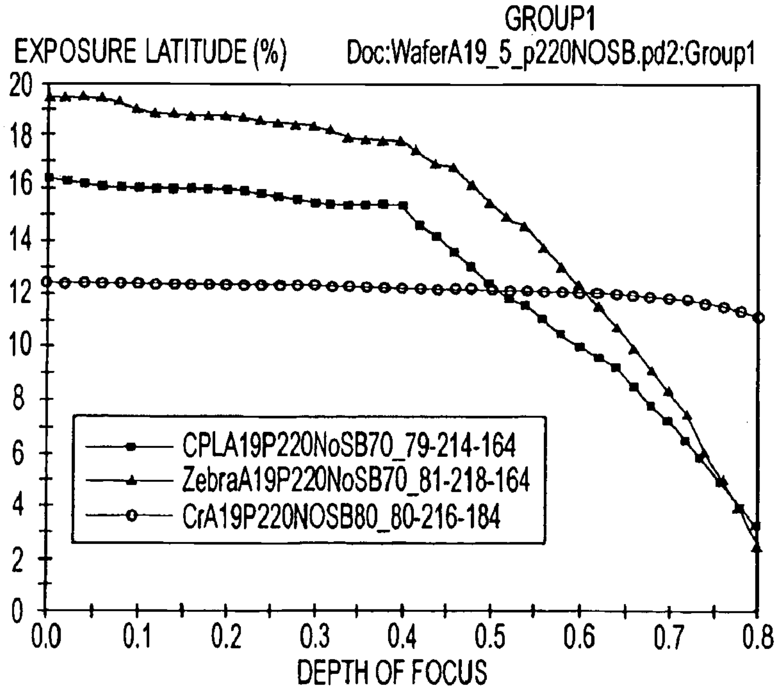
Figure 19C:
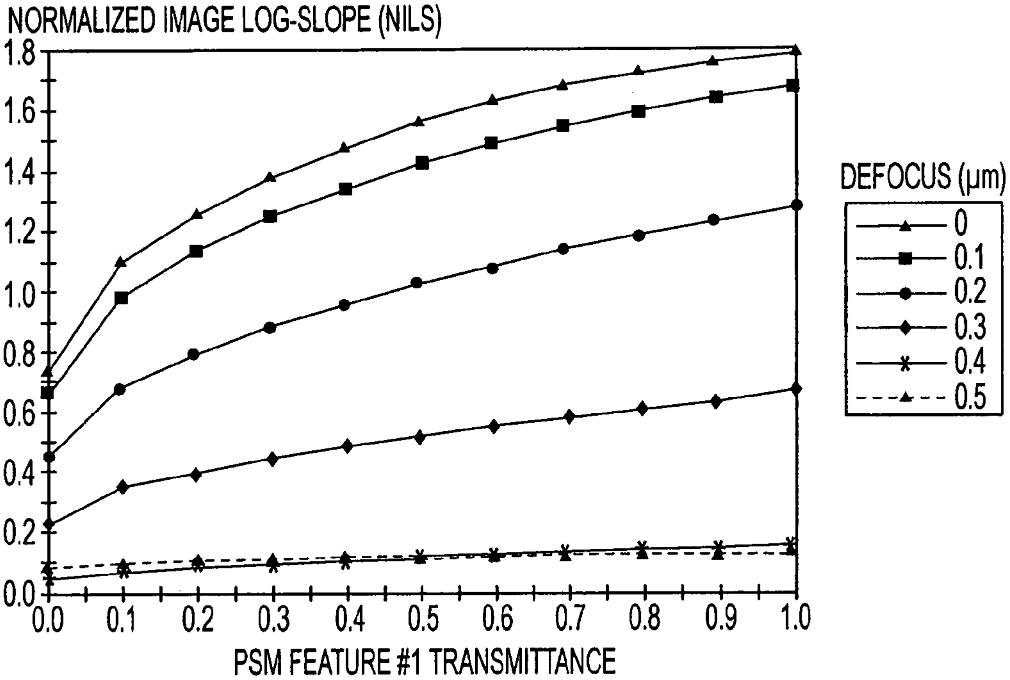
Figure 19D:
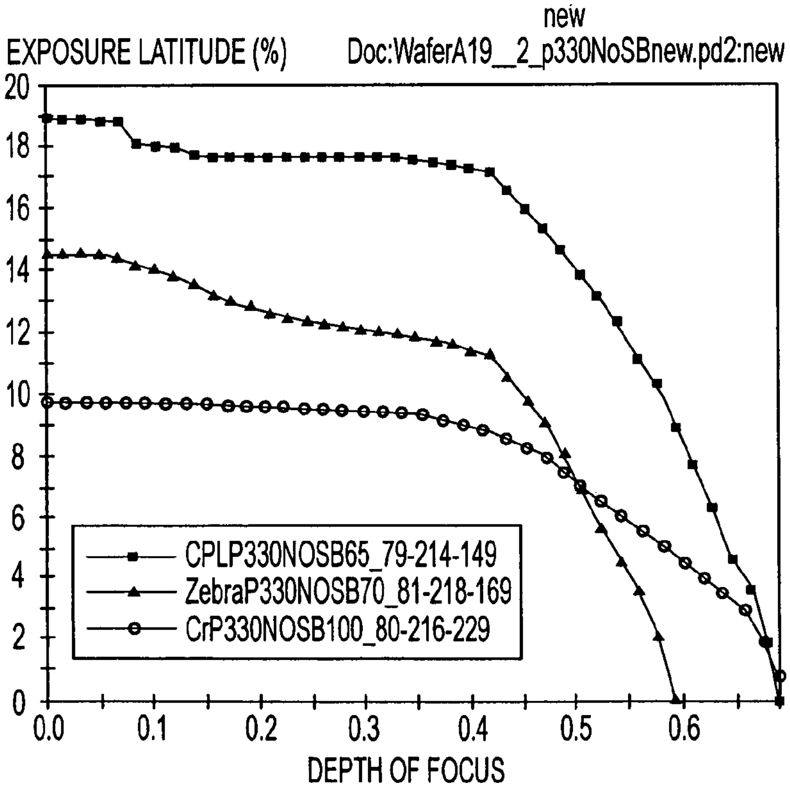
Figure 19E:
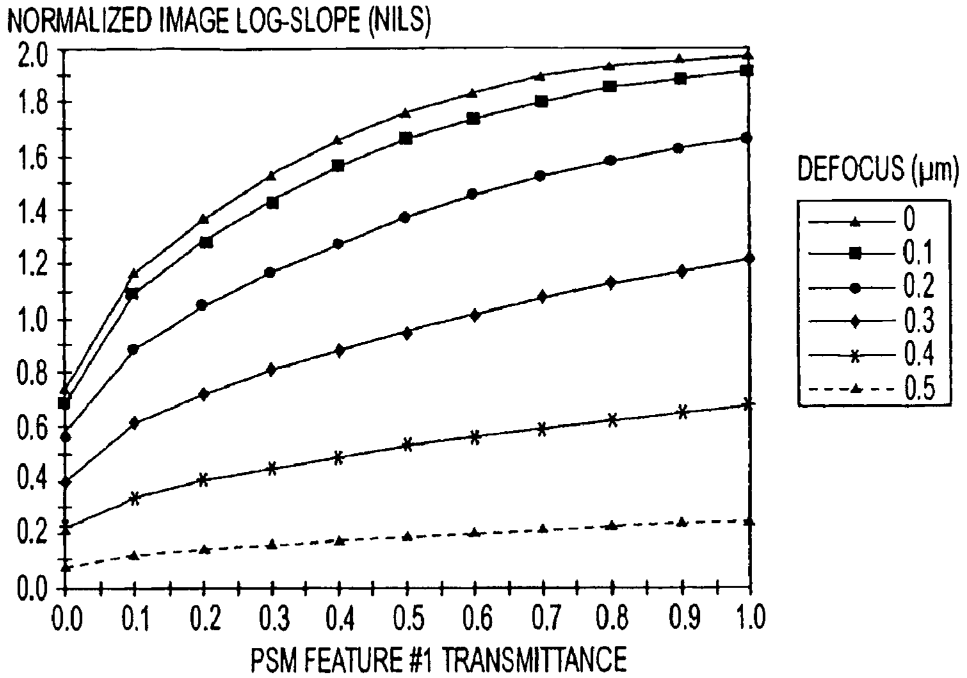
Figure 19F:
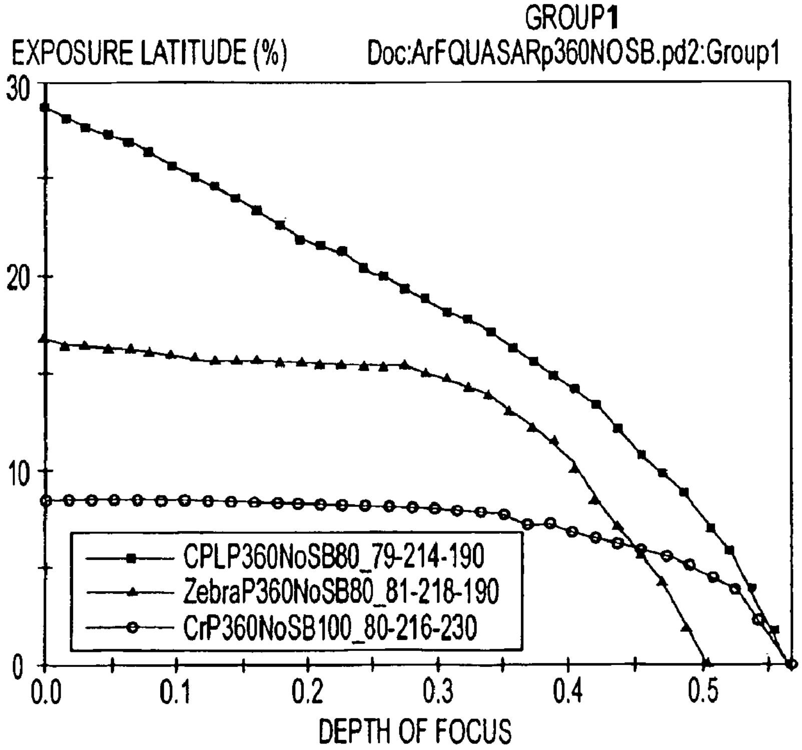

As noted, X-dipole illumination was used in the transmission tuning experiments, and the targeted CD was 70 nm at 160 nm pitch. Three types of structures were used: pure phase lines, zebra lines, and pure chrome lines, which corresponded to 100%, 40% and 0% transmission, respectively. FIG. 18(*b*) illustrates the exposure-dose comparison for the various transmittance used in the experiment, and shows that the largest exposure latitude is achieved for zebra lines. FIG. 18(*a*) depicts a simulated result of NILS vs. feature transmission as a function of defocus. Referring to FIG. 18(*a*), it is expected that the optimal transmission would be in the range of 30% to 40%. The experimental results of FIG. 18(*b*) confirm that for dipole illumination, zebra lines (halftone lines) yield the best exposure latitude, followed by pure phase lines. The pure chrome lines had the worst performance. Thus, the experimental results agree with the NILS simulation.

Figure 16A:
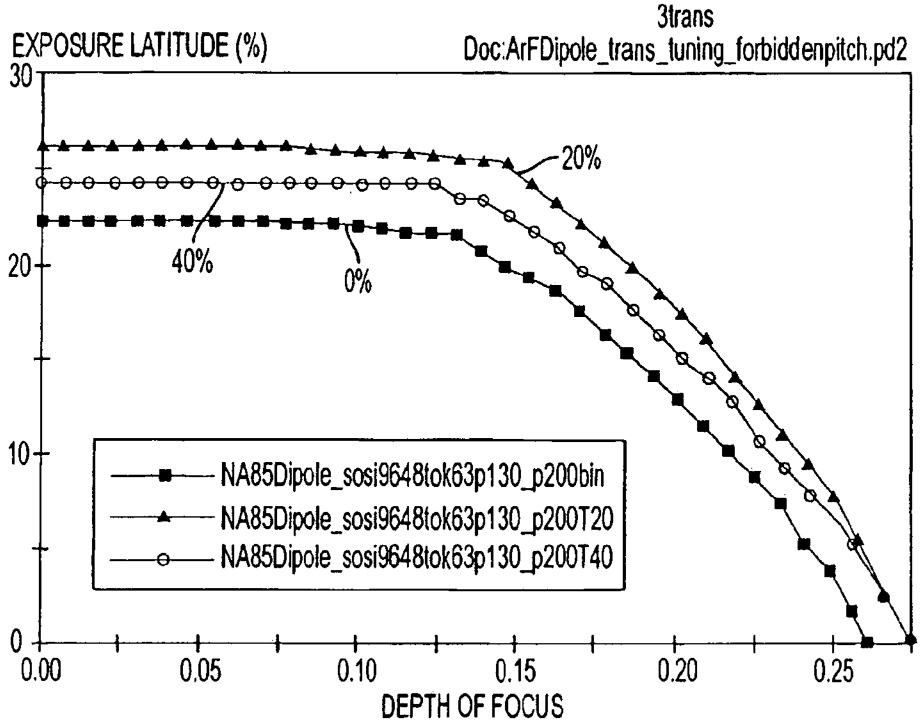
FIGS. 16(*a*) and 16(*b*) illustrate the exposure latitude versus defocus plot and the overlapped process window, respectively, for the given example.
Figure 16B:
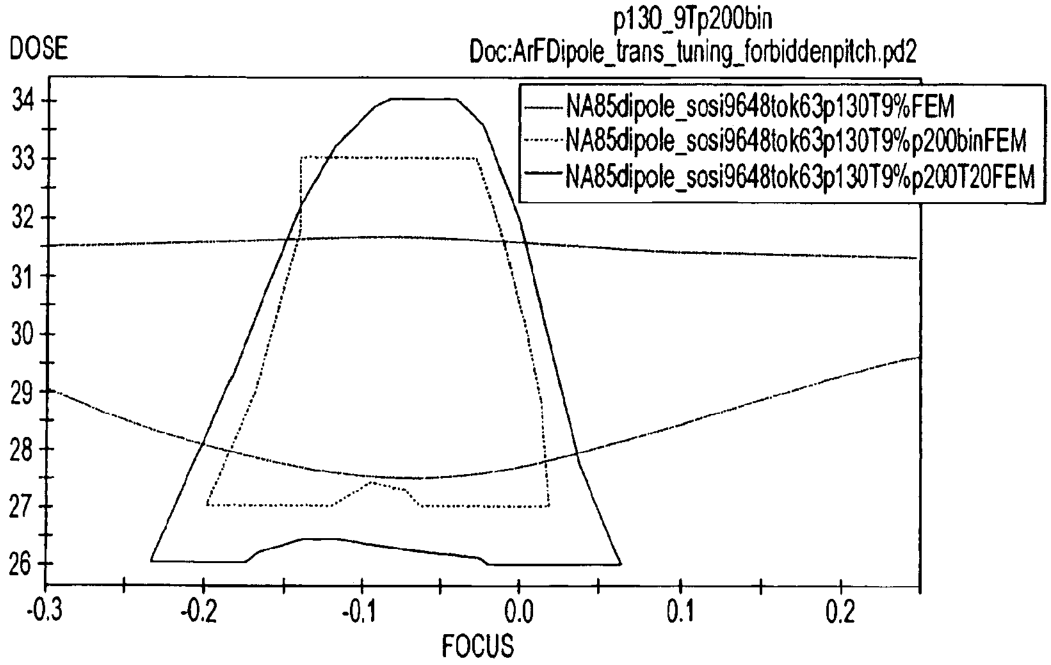

In order to further verify the theory and simulation results through multiple pitches, the same transmission tuning experiments for multiple pitches were tested using QUASAR™ illumination, (30° opening angle, $\sigma_{in}$=0.65, $\sigma_{out}$=0.89). The target CD was 70 nm at a 220 nm pitch. To validate the transmission tuning though pitch, pitches 330 nm, 360 nm and 450 nm were selected for confirmation. FIGS. 19(*a*), 19(*c*) and 19(*e*) correspond to the simulated result illustrating NILS through transmittance for various focus settings for the 220 nm, 330 nm and 360 nm pitches, respectively. FIGS. 19(*b*), 19(*d*) and 19(*f*) correspond to the experimental results for the 220 nm, 330 nm and 360 nm pitches, respectively. More specifically, FIG. 19(*b*) is the transmission tuning result for the 70 nm target CD at a 220 nm dense pitch. The 4X CD on the reticle for chromeless (i.e., 100% transmission, π-phase), zebra and chrome features was 280 nm, 280 nm and 320 nm, respectively. The zebra line was equivalent to ~40% transmission and produced the best exposure latitude. Chromeless was the second best, and chrome was the lowest. FIG. 19(*a*) shows the simulated NILS through focus. As shown, the optimal transmission was approximately 50%, which matches the experimental results quite well. FIG. 19(*d*) shows the transmission tuning for a 330 nm pitch without assist features. The simulated NILS in FIG. 19(*c*) predicts that 100% chromeless gives the best exposure latitude for 330 nm pitch. The experimental results in FIG. 19(*d*) confirm that chromeless has the highest exposure latitude followed by zebra (40% transmission). Chrome has the worst exposure latitude. FIG. 16(*f*) is the transmission tuning result for a 360 nm pitch, which is the forbidden pitch, without scattering bars, the 4X reticle CD is 320 nm for chromeless, zebra and chrome features. The chromeless line has the best exposure latitude followed by the zebra and finally chrome. This experimental result also matches the simulated NILS result in FIG. 19(*e*).

Figure 20A:
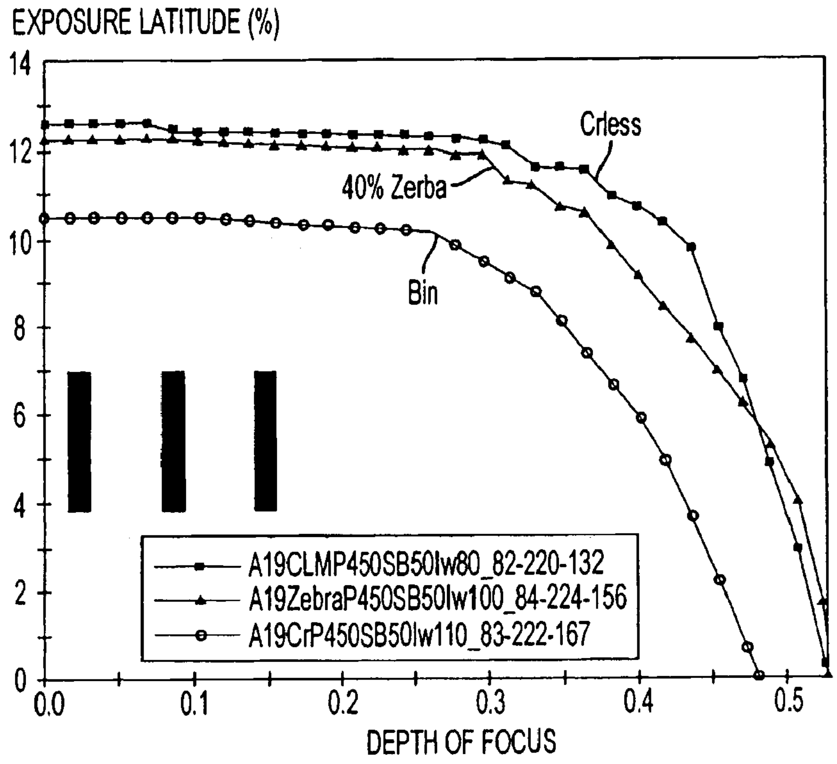
FIG. 20(*a*) illustrates the exposure-dose latitude for 450 nm pitch without utilizing scattering bars.
Figure 20B:
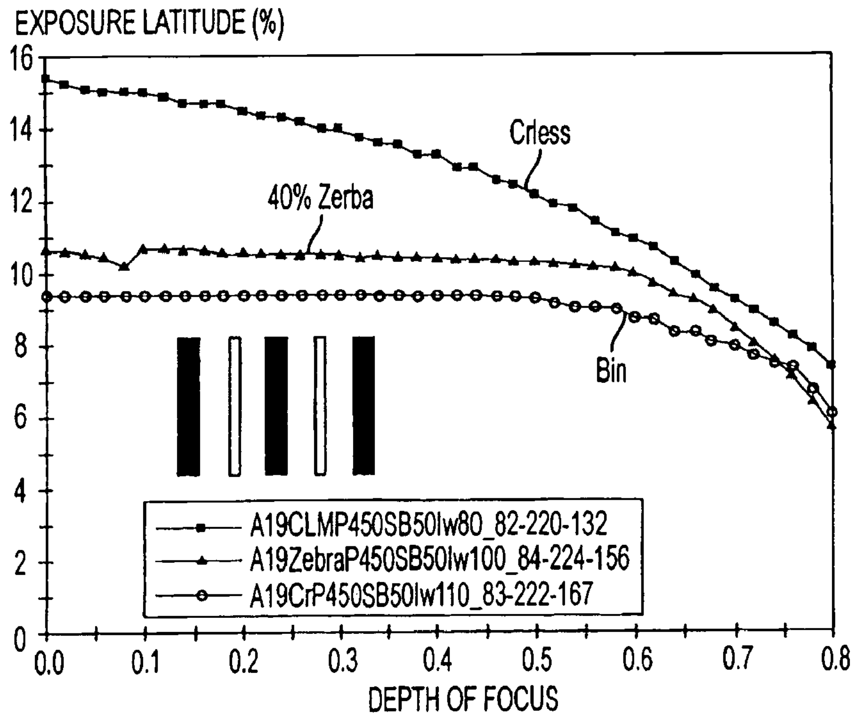

It is noted that transmission tuning can be achieved internally by varying the amount of chrome on the feature itself as discussed above, or externally by utilizing assist features. FIGS. 20(*a*) and 20(*b*) illustrate the experimental results of transmission tuning for ArF, QUASAR™ illumination for 450 nm pitch. Specifically, FIG. 20(*a*) illustrates the exposure-dose latitude for 450 nm pitch without utilizing scattering bars, while FIG. 20(*b*) illustrates the exposure-dose latitude for the same process, with the mask modified to include 50 nm center scattering bars. Referring to FIG. 20(*a*), it is shown that the chromeless line provides the best exposure latitude, the zebra (40% transmission) is the second best, and chrome is the worst. In FIG. 20(*b*), the exposure latitude trend is the same, however, the DOF is better.

Figure 21:
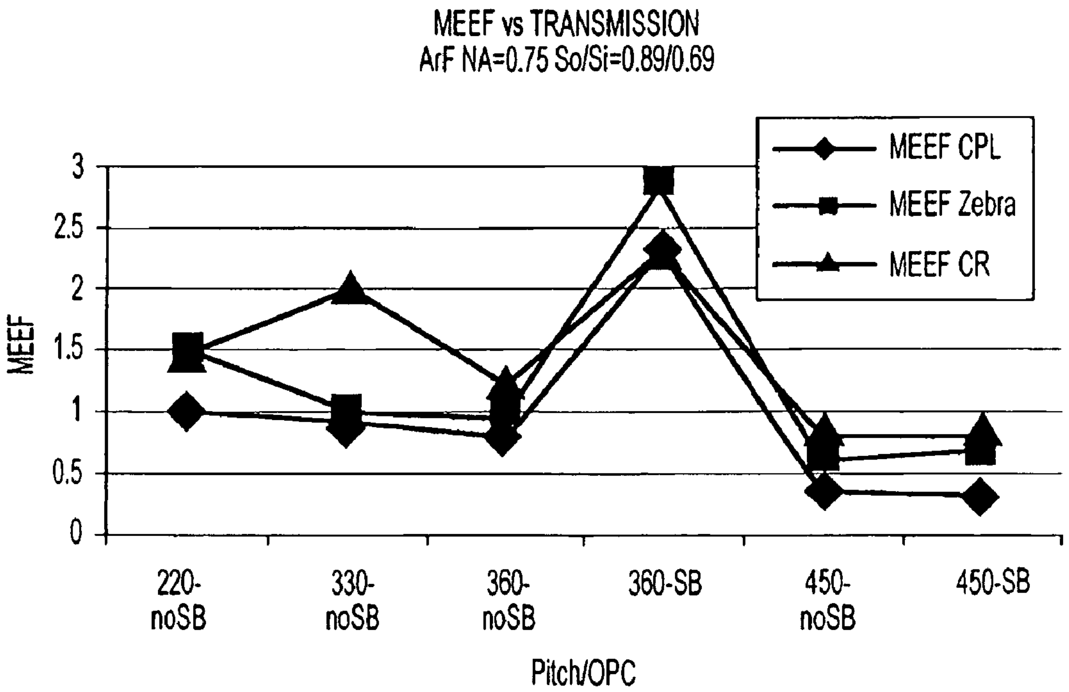
FIG. 21 illustrates a plot of MEEF through pitch for various mask transmittance.

As mentioned previously, MEF (or MEEF) directly impacts the reticle CD tolerance and CD control on the wafer. FIG. 21 illustrates experimental results utilizing the same conditions as utilized in conjunction with FIGS. 18(*a*) and 18(*b*). Referring to FIG. 21, it is shown that the chromeless line has the lowest MEF for pitches in the range of 220 nm to 360 nm. Zebra has a slightly higher MEF and chrome the highest. As is known, higher image contrast will provide better image quality, which produces higher NILS with lower MEF. For a 360 nm pitch with a 50 nm chrome scattering bar, the corresponding MEF increases significantly due to the scattering bar insertion in a very dense pitch region. At larger pitches, the scattering bar is placed further away from the main feature edges, and therefore it is less effective.

As shown in FIG. 21, the scattering bar insertion does not increase MEF for the 450 nm pitch. However, by tuning the transmission in accordance with the method of the present invention, it is possible to control the MEF of the CPL reticle. In other words, the present invention provides a means for optimizing the process latitude for pitch ranges that are to dense too accommodate the insertion of scattering bars.

Figure 22:
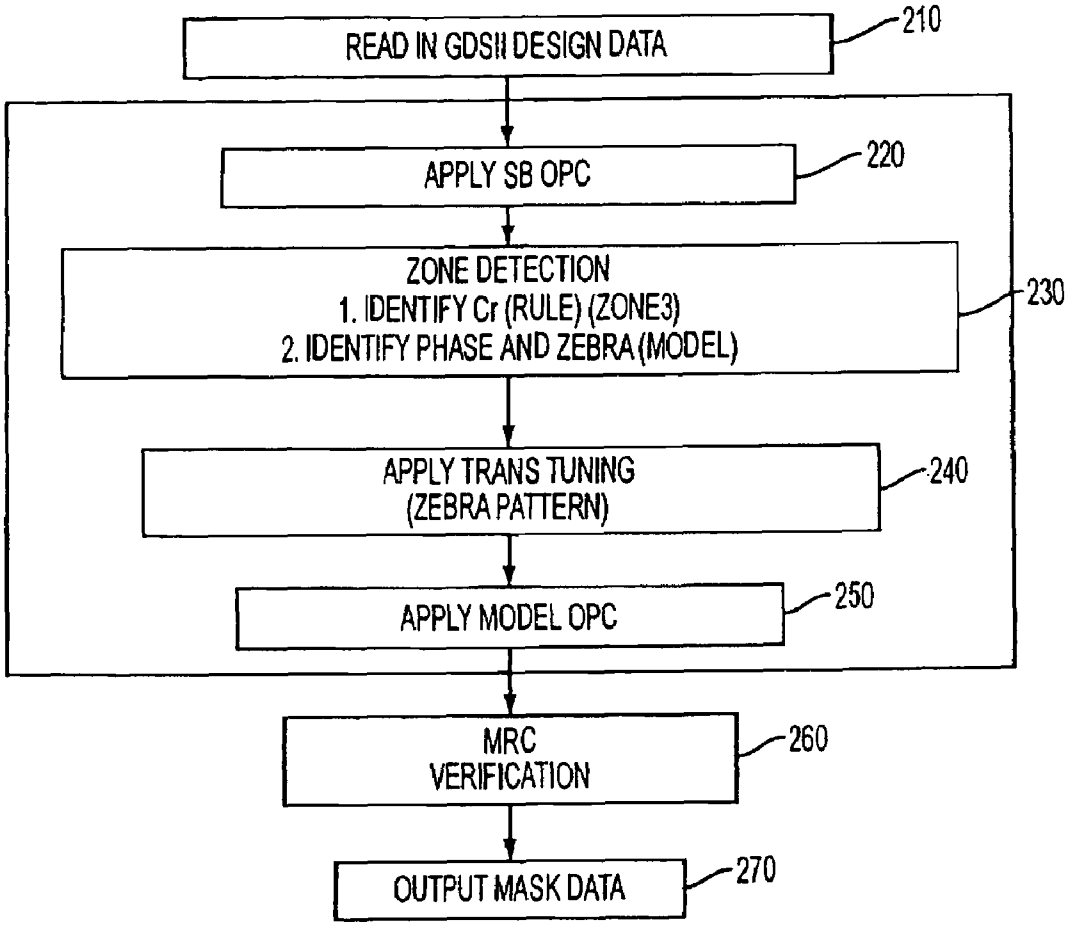
FIG. 22 is a flowchart which sets forth an exemplary process for integrating the process of the present invention into an actual design process flow.

FIG. 22 is a flowchart which set forth an exemplary process for integrating the process of the present invention into an actual design process flow. The first step in the process (Step 210) is read/obtain the design data regarding the target pattern, for example, such data can be in GDSII data format. The next step in the process (Step 220) is to apply scattering bar OPC treatment to the design. This step is performed such that the optical influence of the scattering bars are taken into account while identifying the zones and features that require transmission tuning. The next step in the process (Step 230) is identify and separate the features into two classes, where the first class corresponds to large geometry features that will be implemented in chrome (see, FIG. 9, Zone 3), and the second class which include those features that can be implemented by either phase-edges or chrome halftoning (see, FIG. 9, Zone 1 or 2). It is noted that the Zone 3 features that will be implemented in chrome are typically not critical features, nor do they typically limit the process latitude, and therefore such features do not need to be subjected to the transmission tuning process of the present invention.

Once the Zone 1 and Zone 2 features have been identified, these features are subjected to the transmission tuning process (Step 240) described above, as depicted in flowchart form in FIG. 10. In accordance with the transmission tuning process of the present invention, the forbidden pitches are identified and the mask features are adjusted as necessary to improve the process latitude. Once this process is complete, the next step (Step 250) entails applying model OPC or any other OPC techniques to the modified mask design. Thereafter, a manufacturing rule check step (Step 260) is performed so as to verify the manufacturability of the mask. If the check does not identify an errors, the mask design is complete (Step 270).

Figure 23A:
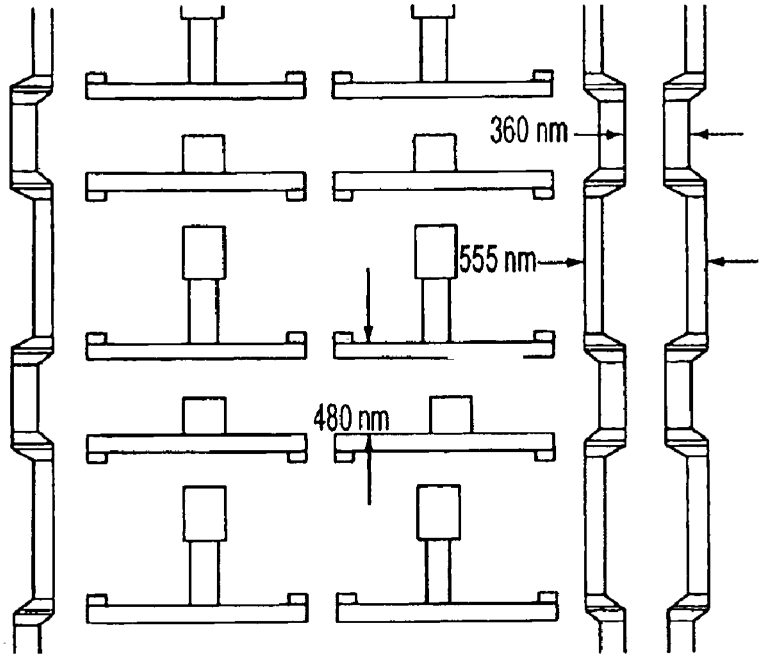
FIGS. 23(*a*)-23(*c*) illustrate an example SRAM layout and how the transmission tuning of the present invention operates on different parts of the design.
Figure 23B:
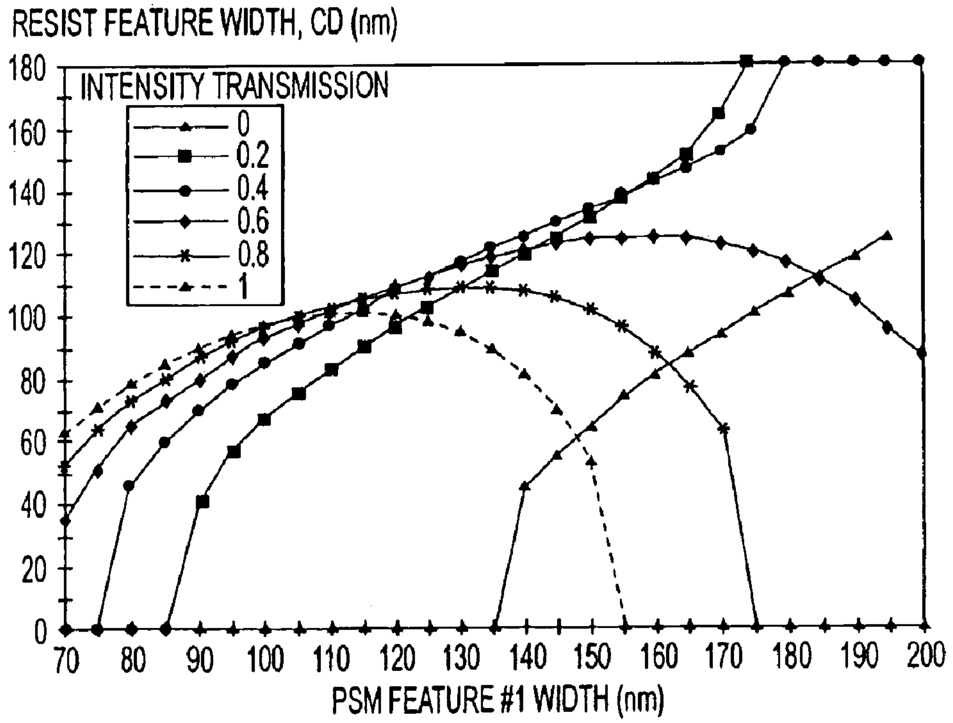
Figure 23C:
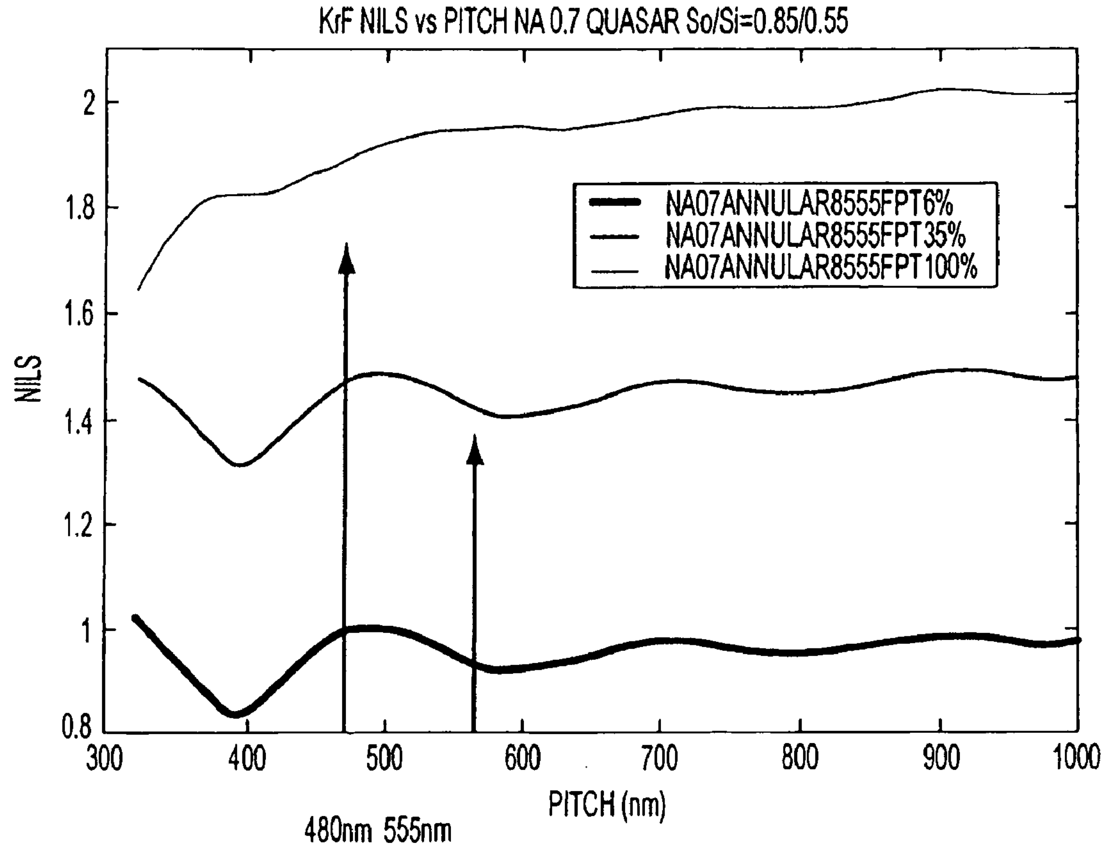
Figure 24A:
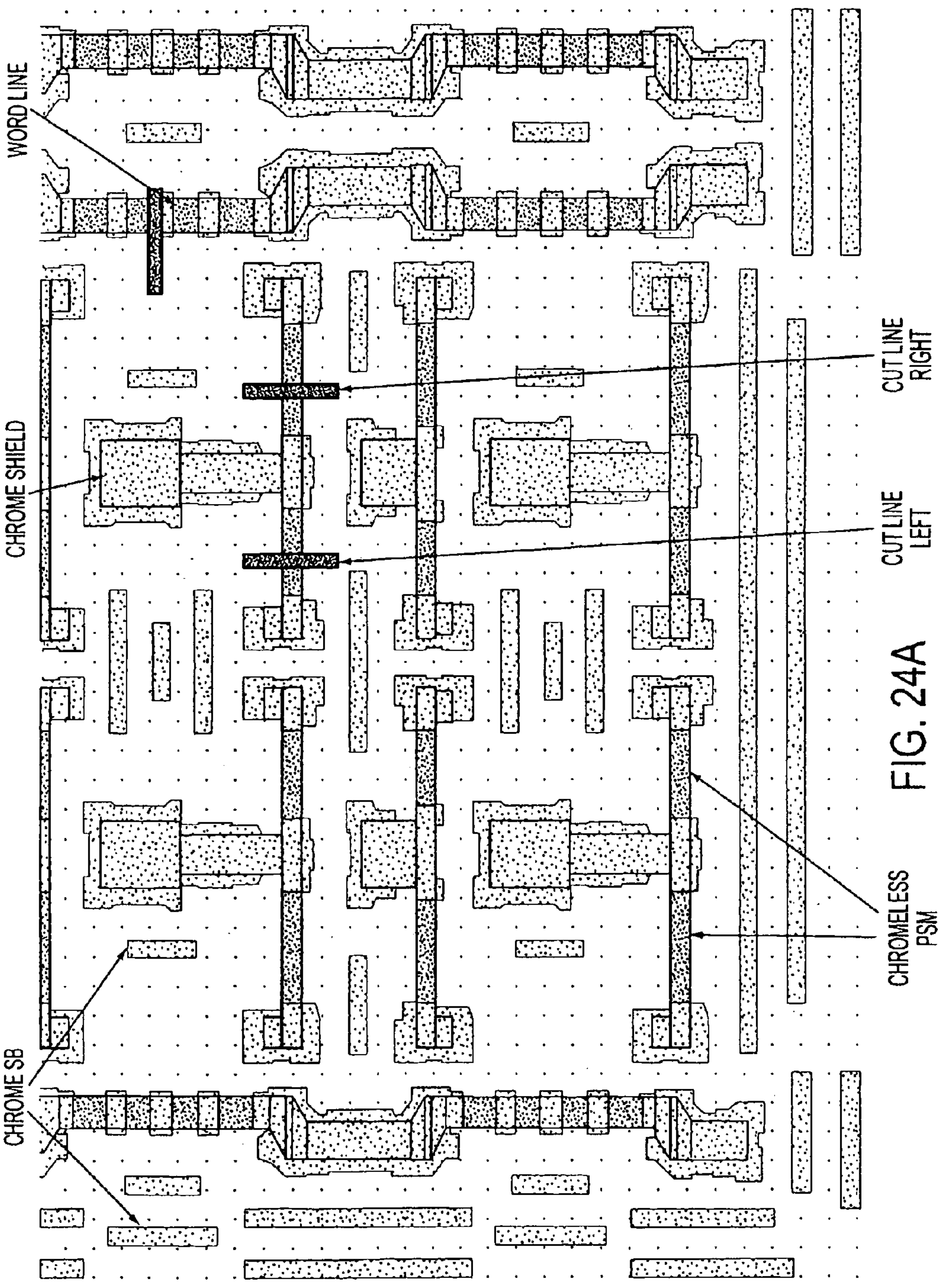
FIGS. 24(*a*) and 24(*b*) illustrate three cut lines which were selected to verify the lithography performance.
Figure 24B:
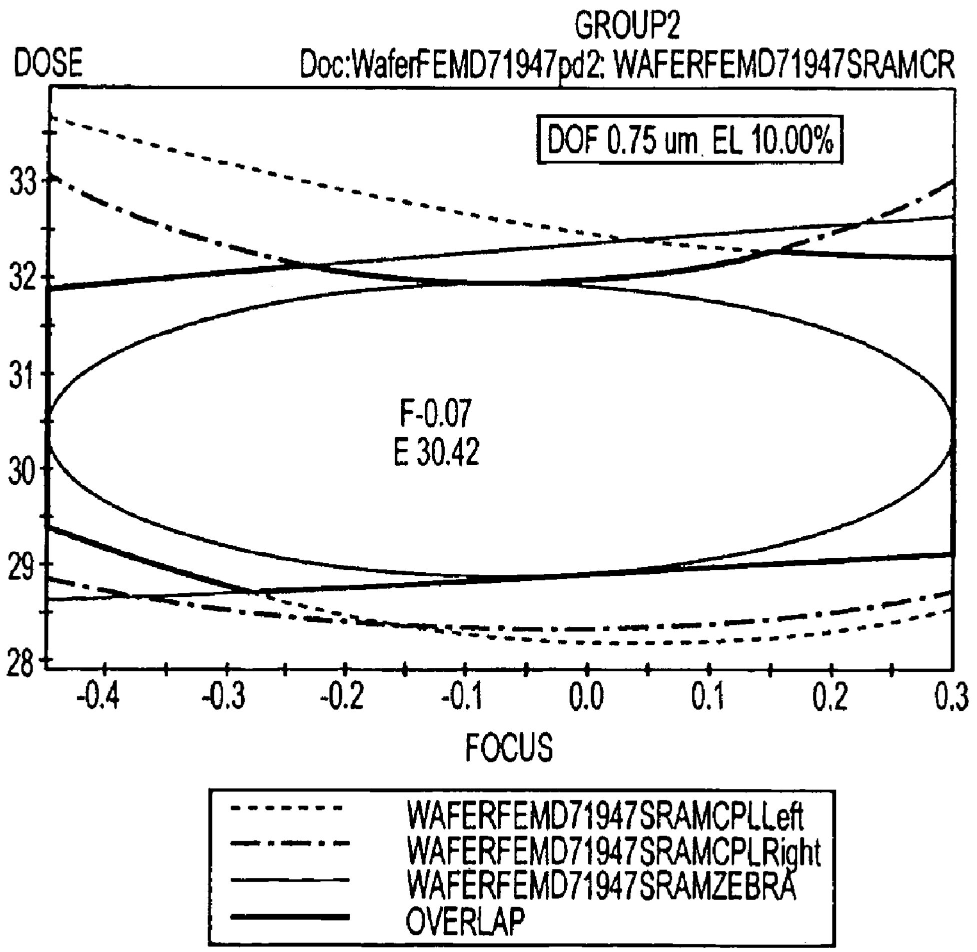

FIG. 23(*a*) illustrates an example of a SRAM layout and how the transmission tuning of the present invention operates on different parts of the design. The exposure tool setting for the SRAM example is KrF, 0.7 NA, annular illumination with $\sigma_{in}$=0.55, $\sigma_{out}$=0.85. FIG. 24(*a*) is the CPL layout converted from the original target layout shown in FIG. 23(*a*). From the design, the pitch between the bit cell transistor is 480 nm. Utilizing 100% transmission, 480 nm pitch has the highest NILS (see, FIG. 23(*c*)), and therefore the 100% transmission is assigned to the transistor gate in the bit cell. The 555 nm pitch with a larger CD target of 115 nm, which cannot be printed with phase lines (see, FIG. 23(*b*)), has a higher NILS utilizing 35% transmission (see, FIG. 23(*c*)). Thus, transmission tuning is required. In other words, the simulated NILS through pitch shows the second weak region is around 550 nm, and the process of the present invention applies a halftoning pattern having approximately 35% transmittance to features within this pitch range so as to improve process latitude.

FIG. 24(*a*) illustrates three cut lines which were selected to verify the lithography performance. In FIG. 24(*a*), the critical horizontal bit cell transistor gate (labeled cut line left and cut line right) is converted into a π-phase line based on critical dimension (CD). The word lines (i.e., vertical) that have a larger target CD were classified into Zone 2 and the halftoning zebra pattern was applied to these features. The experimental FEM data from the three cut lines of he layout of FIG. 24(*a*) were measured for the two horizontal bit cell π-phase gates and the vertical zebra word lines. As shown in FIG. 24(*b*), the overlapped process window for these three cut lines is0.75 um at 10% exposure latitude, which is quite robust for 100 nm technology.

Figure 25:
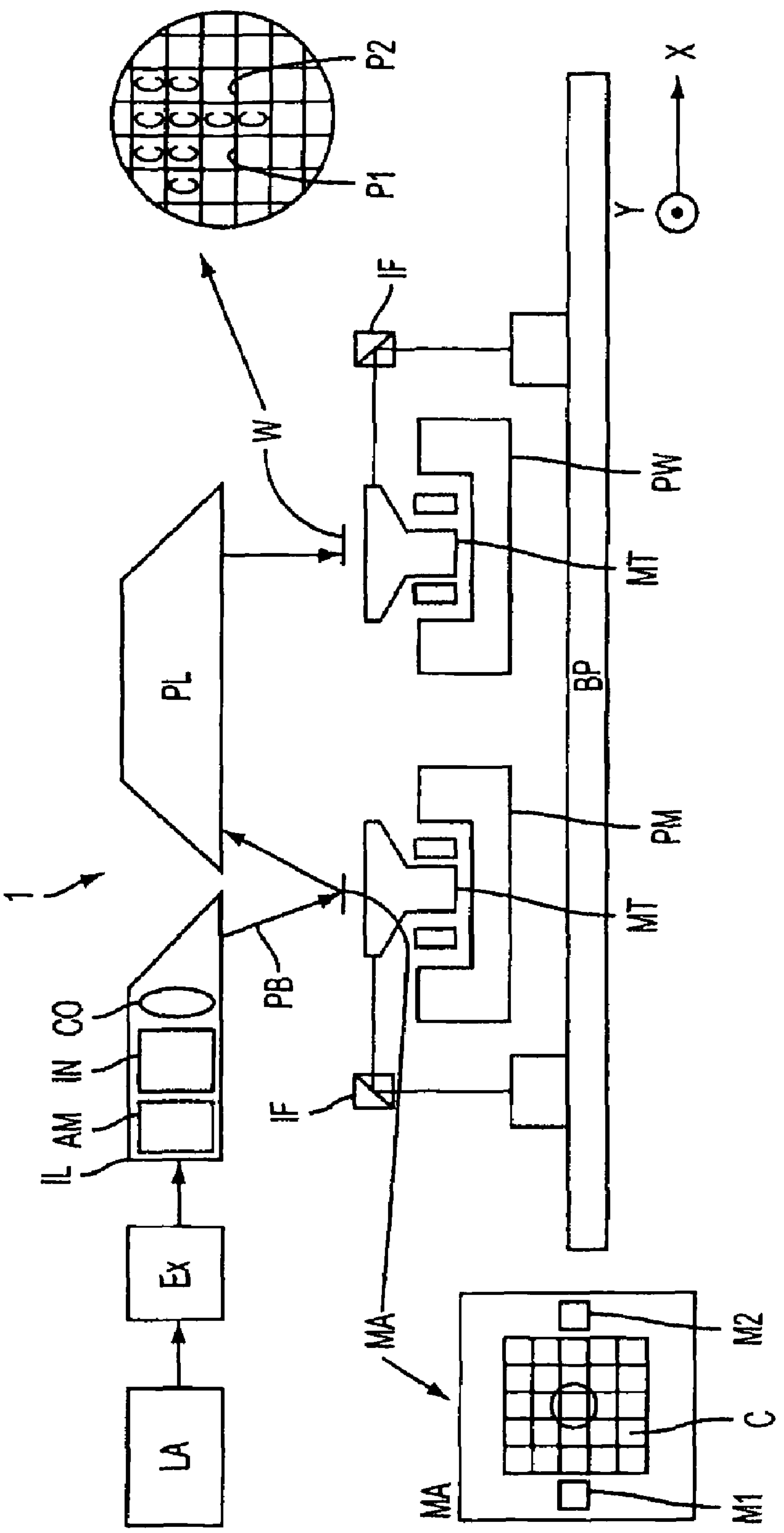
FIG. 25 schematically depicts a lithographic projection apparatus suitable for use with a mask designed with the aid of the current invention.

FIG. 25 schematically depicts a lithographic projection apparatus suitable for use with a mask designed with the aid of the current invention. The apparatus comprises:

- a radiation system Ex, IL, for supplying a projection beam PB of radiation. In this particular case, the radiation system also comprises a radiation source LA;
- a first object table (mask table) MT provided with a mask holder for holding a mask MA (e.g., a reticle), and connected to first positioning means for accurately positioning the mask with respect to item PL;
- a second object table (substrate table) WT provided with a substrate holder for holding a substrate W (e.g. a resist-coated silicon wafer), and connected to second positioning means for accurately positioning the substrate with respect to item PL;
- a projection system ("lens") PL (e.g., a refractive, catoptric or catadioptric optical system) for imaging an irradiated portion of the mask MA onto a target portion C (e.g., comprising one or more dies) of the substrate W.

As depicted herein, the apparatus is of a transmissive type (i.e., has a transmissive mask). However, in general, it may also be of a reflective type, for example (with a reflective mask). Alternatively, the apparatus may employ another kind of patterning means as an alternative to the use of a mask; examples include a programmable mirror array or LCD matrix.

The source LA (e.g., a mercury lamp or excimer laser) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 25 that the source LA may be within the housing of the lithographic projection apparatus (as is often the case when the source LA is a mercury lamp, for example), but that it may also be remote from the lithographic projection apparatus, the radiation beam that it produces being led into the apparatus (e.g., with the aid of suitable directing mirrors); this latter scenario is often the case when the source LA is an excimer laser (e.g., based on KrF, ArF or $F_2$ lasing). The current invention encompasses at least both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means (and interferometric measuring means IF), the substrate table WT can be moved accurately, e.g., so as to position different target portions C in the path of the beam PB. Similarly, the first positioning means can be used to accurately position the mask MA with respect to the path of the beam PB, e.g., after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 25. However, in the case of a wafer stepper (as opposed to a step-and-scan tool) the mask table MT may just be connected to a short stroke actuator, or may be fixed.

The depicted tool can be used in two different modes:

- In step mode, the mask table MT is kept essentially stationary, and an entire mask image is projected in one go (i.e. a single "flash") onto a target portion C. The substrate table WT is then shifted in the x and/or y directions so that a different target portion C can be irradiated by the beam PB;
- In scan mode, essentially the same scenario applies, except that a given target portion C is not exposed in a single "flash". Instead, the mask table MT is movable in a given direction (the so-called "scan direction", e.g., the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

The concepts disclosed herein may simulate or mathematically model any generic imaging system for imaging sub wavelength features, and may be especially useful with emerging imaging technologies capable of producing wavelengths of an increasingly smaller size. Emerging technologies already in use include EUV (extreme ultra violet) lithography that is capable of producing a 193 nm wavelength with the use of a ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range. Because most materials are absorptive within this range, illumination may be produced by reflective mirrors with a multi-stack of Molybdenum and Silicon. The multi-stack mirror has a 40 layer pairs of Molybdenum and Silicon where the thickness of each layer is a quarter wavelength. Even smaller wavelengths may be produced with X-ray lithography. Typically, a synchrotron is used to produce an X-ray wavelength. Since most material is absorptive at x-ray wavelengths, a thin piece of absorbing material defines where features would print (positive resist) or not print (negative resist).

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

Software functionalities of a computer system involve programming, including executable code, may be used to implement the above described imaging model. The software code is executable by the general-purpose computer. In operation, the code and possibly the associated data records are stored within a general-purpose computer platform. At other times, however, the software may be stored at other locations and/or transported for loading into the appropriate general-purpose computer systems. Hence, the embodiments discussed above involve one or more software products in the form of one or more modules of code carried by at least one machine-readable medium. Execution of such code by a processor of the computer system enables the platform to implement the catalog and/or software downloading functions, in essentially the manner performed in the embodiments discussed and illustrated herein.

As used herein, terms such as computer or machine "readable medium" refer to any medium that participates in providing instructions to a processor for execution. Such a medium may take many forms, including but not limited to, non-volatile media, volatile media, and transmission media. Non-volatile media include, for example, optical or magnetic disks, such as any of the storage devices in any computer(s) operating as one of the server platform, discussed above. Volatile media include dynamic memory, such as main memory of such a computer platform. Physical transmission media include coaxial cables; copper wire and fiber optics, including the wires that comprise a bus within a computer system. Carrier-wave transmission media can take the form of electric or electromagnetic signals, or acoustic or light waves such as those generated during radio frequency (RF) and infrared (IR) data communications. Common forms of computer-readable media therefore include, for example: a floppy disk, a flexible disk, hard disk, magnetic tape, any other magnetic medium, a CD-ROM, DVD, any other optical medium, less commonly used media such as punch cards, paper tape, any other physical medium with patterns of holes, a RAM, a PROM, and EPROM, a FLASH-EPROM, any other memory chip or cartridge, a carrier wave transporting data or instructions, cables or links transporting such a carrier wave, or any other medium from which a computer can read programming code and/or data. Many of these forms of computer readable media may be involved in carrying one or more sequences of one or more instructions to a processor for execution.

Although the present invention has been described and illustrated in detail, it is to be clearly understood that the same is by way of illustration and example only and is not to be taken by way of limitation, the scope of the present invention being limited only by the terms of the appended claims.

What is claimed is:

1. A method of generating a mask for use in a photolithography process, said method comprising the steps of:

determining a target mask pattern having a plurality of features to be imaged and an illumination system to be utilized to image said mask;

identifying a critical pitch within said target pattern and optimizing illumination settings of said illumination system for imaging said critical pitch;

identifying a forbidden pitch within said target pattern; and modifying the transmittance of said features having a pitch equal to or substantially equal to said forbidden pitch such that the exposure latitude of the features equal to or substantially equal to said forbidden pitch is increased.

2. The method for generating a mask according to claim 1, further comprising the step of modifying the transmittance of features within said target pattern having a pitch equal to or substantially equal to said critical pitch such that the exposure latitude of the features equal to or substantially equal to said critical pitch is increased.

3. The method for generating a mask according to claim 1, wherein said step of identifying said forbidden pitch comprises determining a normalized image log slope (NILS) versus pitch utilizing said optimized illumination settings, and identifying pitches having the lowest NILS value.

4. The method for generating a mask according to claim 3, wherein said step of modifying said transmittance of said features having a pitch equal to or substantially equal to said forbidden pitch comprises determining a normalized image log slope (NILS) versus transmittance at the forbidden pitch and selecting the transmittance value having the highest NILS value.

5. The method for generating a mask according to claim 2, wherein said step of modifying said transmittance of said features having a pitch equal to or substantially equal to said critical pitch comprises determining a normalized image log slope (NILS) versus transmittance at the critical pitch and selecting the transmittance value having the highest NILS value.

6. The method for generating a mask according to claim 4, wherein said step modifying said transmittance of said features having a pitch equal to or substantially equal to said forbidden pitch further comprises modifying the target pattern by halftoning said features.

7. A program product, comprising executable code transportable by at least one machine readable medium, wherein execution of the code by at least one programmable computer causes the at least one programmable computer to perform a sequence of steps for generating a mask for use in a photolithography process, said steps comprising:

determining a target mask pattern having a plurality of features to be imaged and an illumination system to be utilized to image said mask;

identifying a critical pitch within said target pattern and optimizing illumination settings of said illumination system for imaging said critical pitch;

identifying a forbidden pitch within said target pattern; and modifying the transmittance of said features having a pitch equal to or substantially equal to said forbidden pitch such that the exposure latitude of the features equal to or substantially equal to said forbidden pitch is increased.

8. The program product for generating a mask according to claim 7, further comprising the step of modifying the transmittance of features within said target pattern having a pitch equal to or substantially equal to said critical pitch such that the exposure latitude of the features equal to or substantially equal to said critical pitch is increased.

9. The program product for generating a mask according to claim 7, wherein said step of identifying said forbidden pitch comprises determining a normalized image log slope (NILS) versus pitch utilizing said optimized illumination settings, and identifying pitches having the lowest NILS value.

10. The program product for generating a mask according to claim 9, wherein said step of modifying said transmittance of said features having a pitch equal to or substantially equal to said forbidden pitch comprises determining a normalized image log slope (NILS) versus transmittance at the forbidden pitch and selecting the transmittance value having the highest NILS value.

11. The program product for generating a mask according to claim 8, wherein said step of modifying said transmittance of said features having a pitch equal to or substantially equal to said critical pitch comprises determining a normalized image log slope (NILS) versus transmittance at the critical pitch and selecting the transmittance value having the highest NILS value.

12. The program product for generating a mask according to claim 10, wherein said step modifying said transmittance of said features having a pitch equal to or substantially equal to said forbidden pitch further comprises modifying the target pattern by halftoning said features.

* * * * *